(12) United States Patent
Coolbaugh et al.

(10) Patent No.: US 6,876,028 B1
(45) Date of Patent: Apr. 5, 2005

(54) METAL-INSULATOR-METAL CAPACITOR AND METHOD OF FABRICATION

(75) Inventors: Douglas D. Coolbaugh, Essex Junction, VT (US); Ebenezer E. Eshun, Essex Junction, VT (US); Jeffrey P. Gambino, Westford, VT (US); Zhong-Xiang He, Essex Junction, VT (US); Vidhya Ramachandran, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/605,444

(22) Filed: Sep. 30, 2003

(51) Int. Cl.[7] .................. H10L 27/108; H10L 29/76; H10L 29/94; H10L 31/119

(52) U.S. Cl. .................. 257/306; 257/304; 257/305; 257/311; 257/751; 257/753

(58) Field of Search ................. 257/751, 305, 257/304, 306, 311, 758

(56) References Cited

U.S. PATENT DOCUMENTS

| | | | |
|---|---|---|---|
| 5,406,447 A | | 4/1995 | Miyazaki |
| 6,329,234 B1 | | 12/2001 | Ma et al. |
| 6,368,953 B1 | | 4/2002 | Petrarca et al. |
| 6,451,664 B1 | * | 9/2002 | Barth et al. ............ 438/396 |
| 6,461,914 B1 | * | 10/2002 | Roberts et al. .......... 438/253 |
| 6,720,608 B2 | * | 4/2004 | Lee ........................ 257/306 |
| 6,734,489 B2 | * | 5/2004 | Morimoto et al. ....... 257/306 |
| 6,764,915 B2 | * | 7/2004 | Lee ........................ 438/396 |
| 2003/0032234 A1 | * | 2/2003 | Suzuki .................... 438/239 |

* cited by examiner

Primary Examiner—Nathan J. Flynn
Assistant Examiner—Victor A. Mandala, Jr.
(74) Attorney, Agent, or Firm—Schmeiser, Olsen & Watts; William D. Sabo

(57) ABSTRACT

A method and structure for a MIM capacitor, the structure including: an electronic device, comprising: an interlevel dielectric layer formed on a semiconductor substrate; a copper bottom electrode formed in the interlevel dielectric layer, a top surface of the bottom electrode co-planer with a top surface of the interlevel dielectric layer; a conductive diffusion barrier in direct contact with the top surface of the bottom electrode; a MIM dielectric in direct contact with a top surface of the conductive diffusion barrier; and a top electrode in direct contact with a top surface of the MIM dielectric. The conductive diffusion barrier may be recessed into the copper bottom electrode or an additional recessed conductive diffusion barrier provided. Compatible resistor and alignment mark structures are also disclosed.

19 Claims, 21 Drawing Sheets

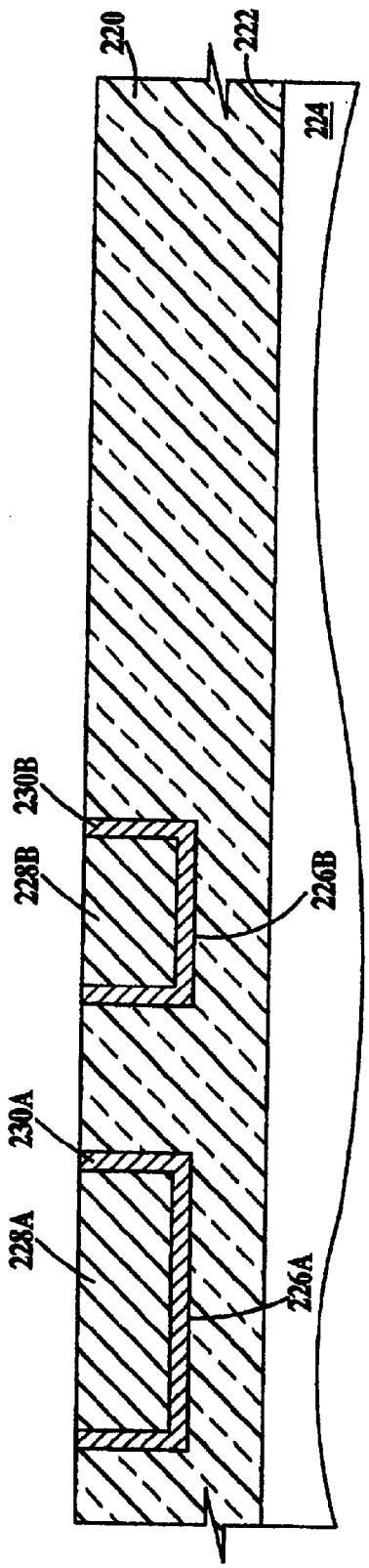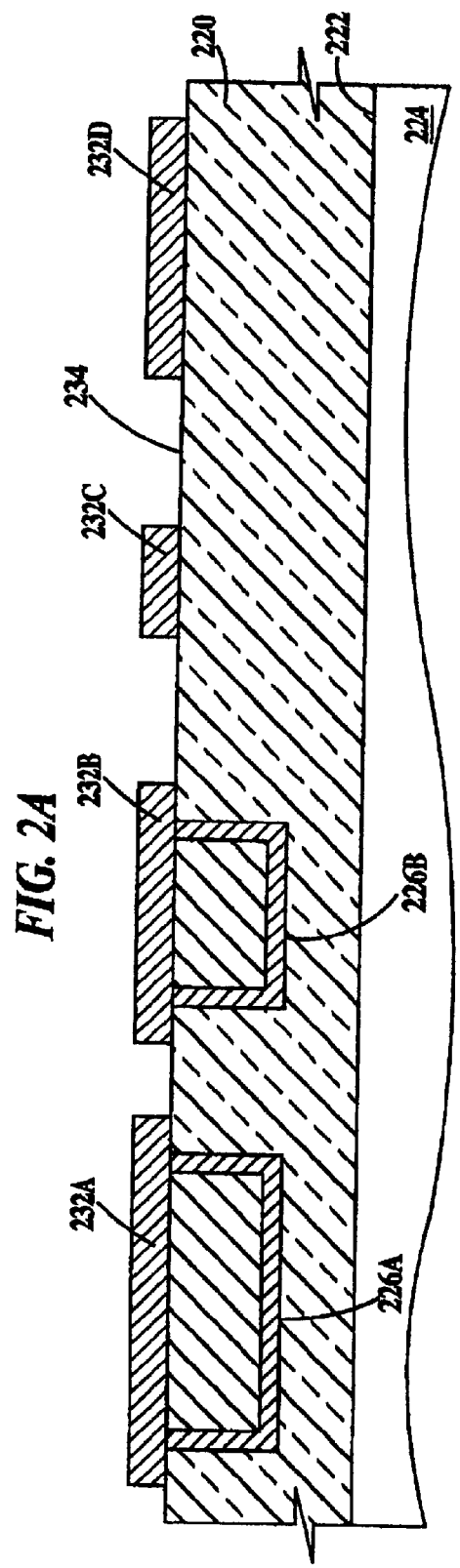
FIG. 2A
FIG. 2B

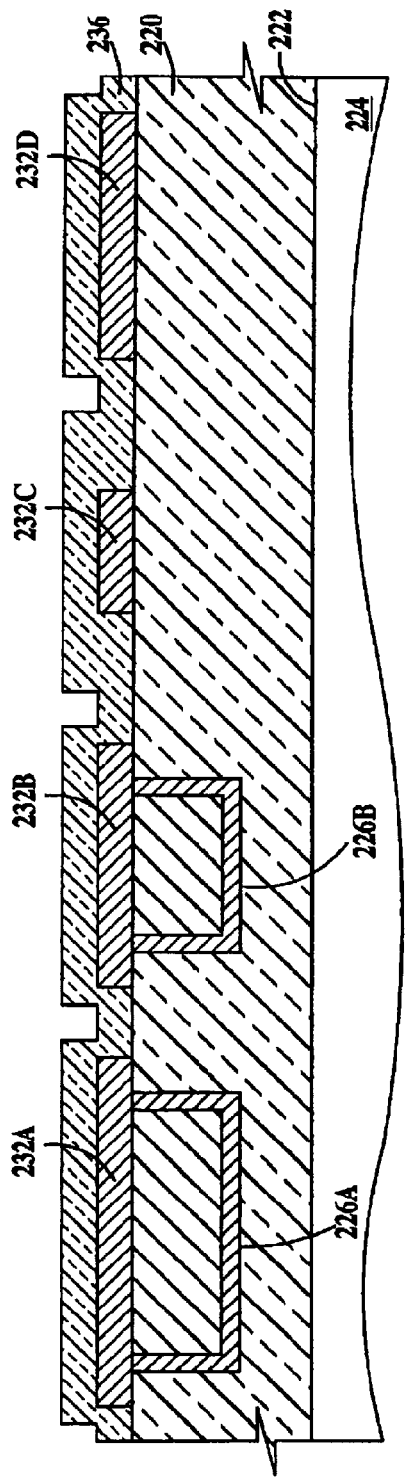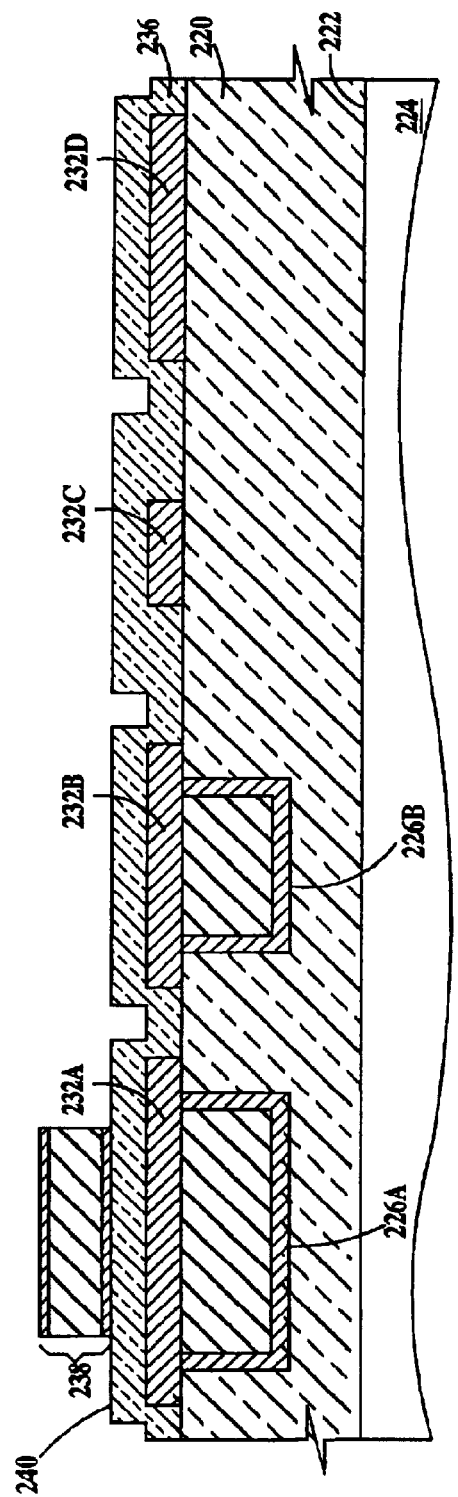
FIG. 2C
FIG. 2D

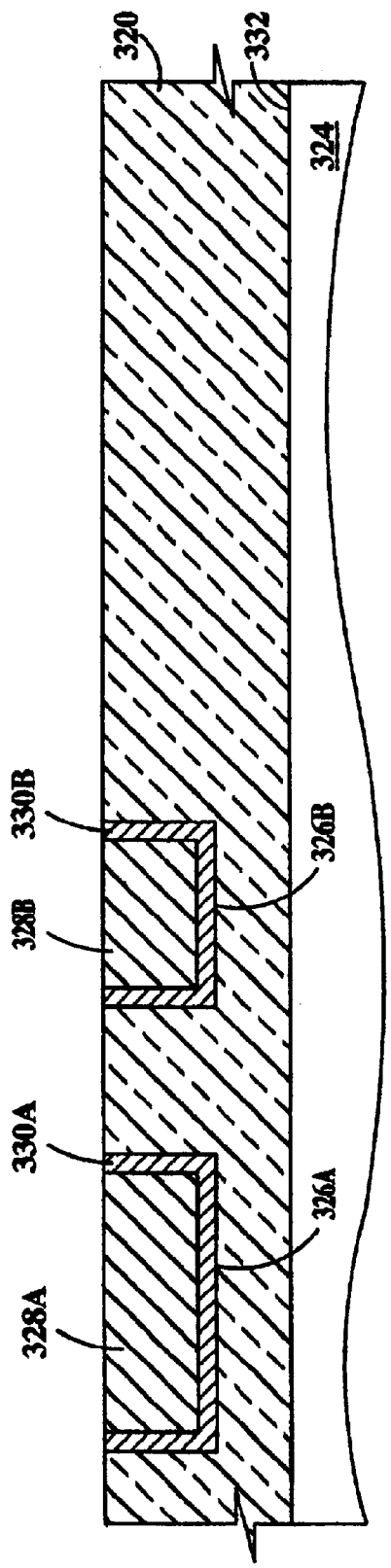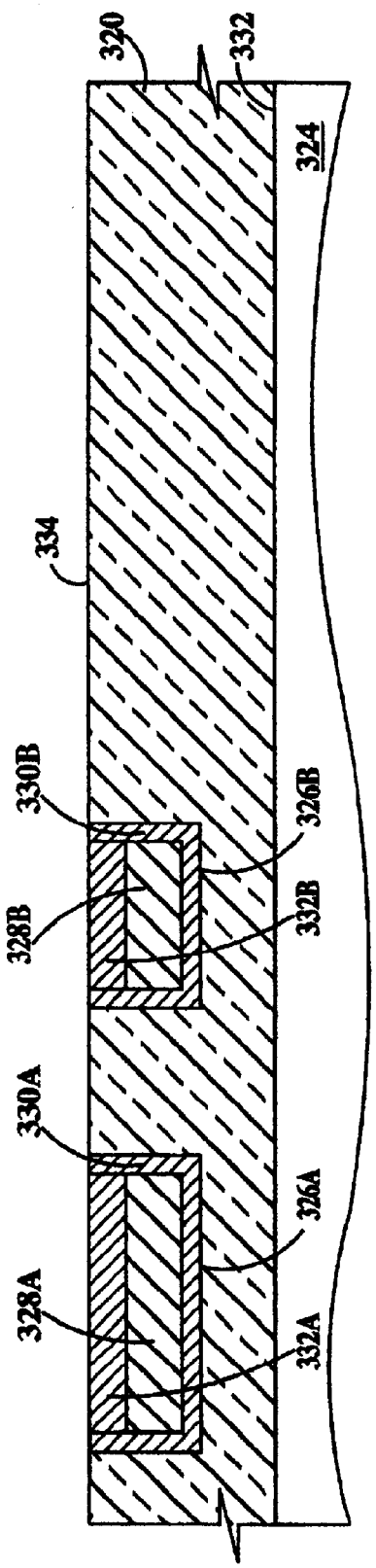
FIG. 4A
FIG. 4B

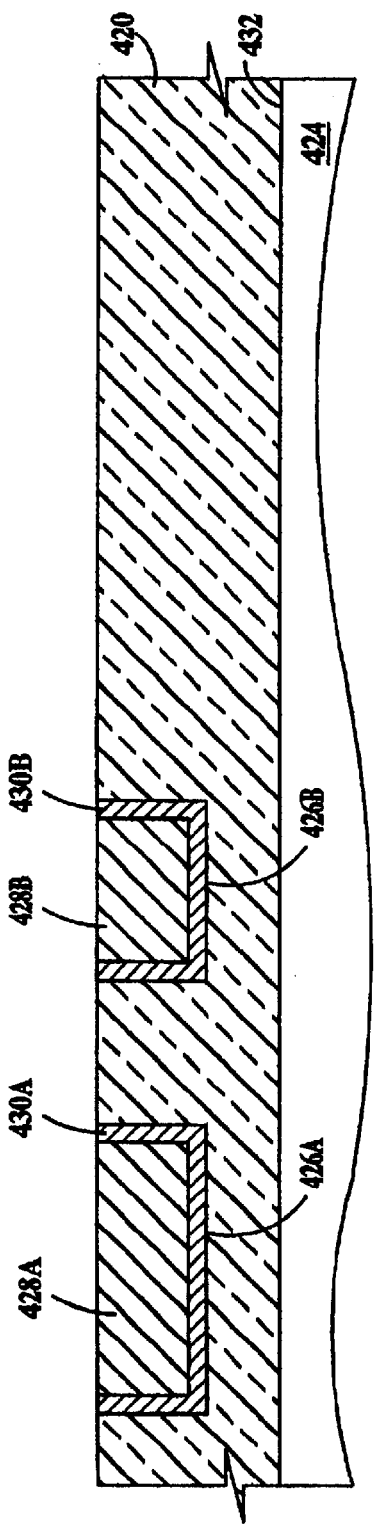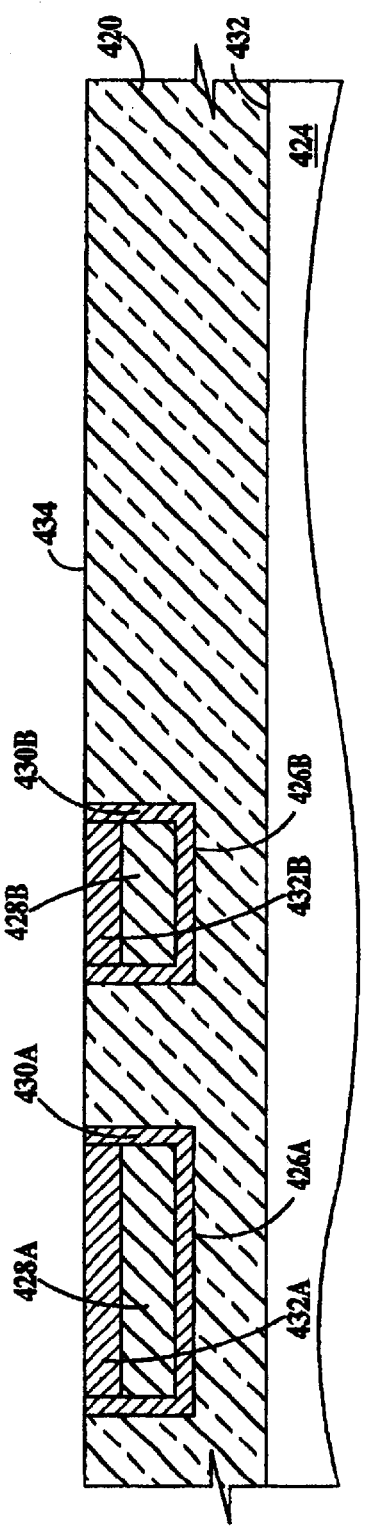
FIG. 5A
FIG. 5B

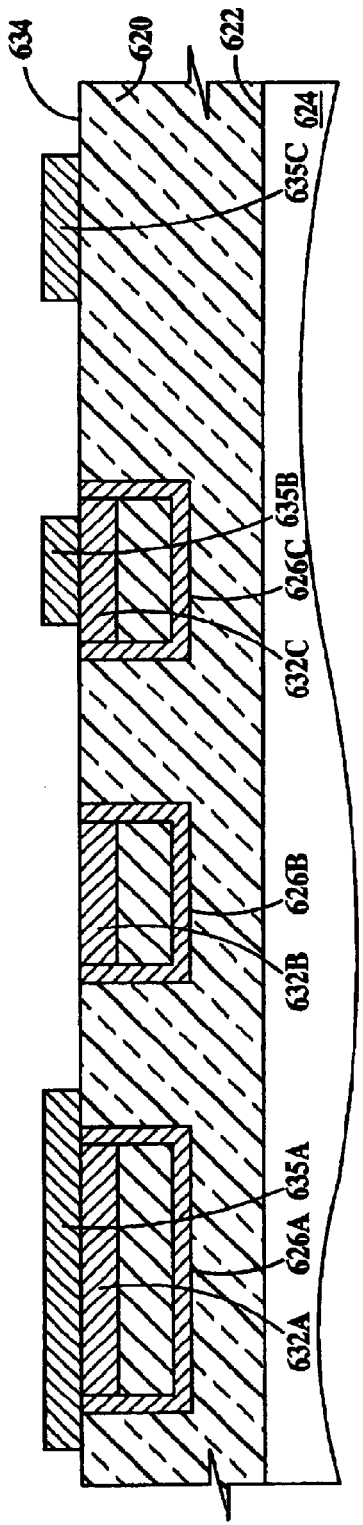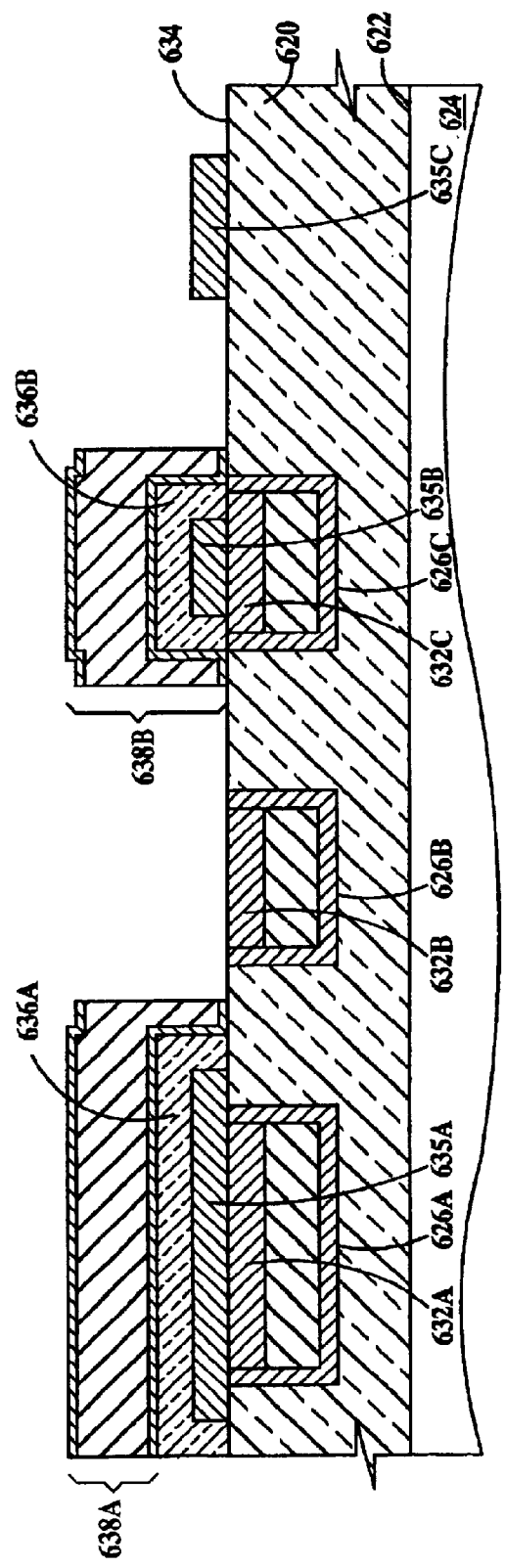
FIG. 7C
FIG. 7D

METAL-INSULATOR-METAL CAPACITOR AND METHOD OF FABRICATION

BACKGROUND OF INVENTION

1. Field of the Invention

The present invention relates to the field of semiconductor structures and processing; more specifically, it relates to a metal-insulator-metal (MIM) capacitor compatible with high K dielectric materials and copper metallurgy and the method of fabricating the MIM.

2. Background of the Invention

MIM capacitors are increasingly being used in integrated circuits, especially those integrated circuits used in radio frequency (RF) and other high-frequency applications. The requirements for high performance capacitors compatible with ever high frequency applications has driven the industry to use high-k dielectric materials for the insulator in the MIM capacitor. However, high-k dielectrics have serious shortcomings when used in integrated circuits having copper interconnections, most notably the poor resistance to copper diffusion, which can lead to yield or reliability problems. Therefore, there is a need for a MIM structure and fabrication method compatible with copper interconnection technology.

SUMMARY OF INVENTION

A first aspect of the present invention is an electronic device, comprising: an interlevel dielectric layer formed on a semiconductor substrate; a copper bottom electrode formed in the interlevel dielectric layer, a top surface of the bottom electrode co-planer with a top surface of the interlevel dielectric layer; a conductive diffusion barrier in direct contact with the top surface of the bottom electrode; a MIM dielectric in direct contact with a top surface of the conductive diffusion barrier; and a top electrode in direct contact with a top surface of the MIM dielectric.

A second aspect of the present invention is an electronic device, comprising: an interlevel dielectric layer formed on a semiconductor substrate; a copper bottom electrode formed in the interlevel dielectric layer; a conductive diffusion barrier in direct contact with a top surface of the bottom electrode, the top surface of the bottom electrode recessed below a top surface of the interlevel dielectric layer, the top surface of the conductive diffusion barrier co-planer with the top surface of the interlevel dielectric layer; a MIM dielectric in direct contact with a top surface of the conductive diffusion barrier; and a top electrode in direct contact with a top surface of the MIM dielectric.

A third aspect of the present invention is a method of fabricating an electronic device, comprising: (a) providing a semiconductor substrate (b) forming an interlevel dielectric layer on the semiconductor substrate; (c) forming a copper bottom electrode in the interlevel dielectric layer, a top surface of the bottom electrode co-planer with a top surface of the interlevel dielectric layer; (d) forming a conductive diffusion barrier in direct contact with the top surface of the bottom electrode; (e) forming a MIM dielectric in direct contact with a top surface of the conductive diffusion barrier; and (f) forming a top electrode in direct contact with a top surface of the MIM dielectric.

A fourth aspect of the present invention is a method of fabricating an electronic device, comprising: (a) providing a semiconductor substrate; (b) forming an interlevel dielectric layer on the semiconductor substrate; (c) forming a copper bottom electrode in the interlevel dielectric layer; (d) forming a conductive diffusion barrier in direct contact with a top surface of the bottom electrode, the top surface of the bottom electrode recessed below a top surface of the interlevel dielectric layer, the top surface of the conductive diffusion barrier co-planer with the top surface of the interlevel dielectric; (e) forming a MIM dielectric in direct contact with the top surface of the conductive diffusion barrier; and (f) forming a top electrode in direct contact with a top surface of the MIM dielectric.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

FIGS. 2A through 2F are cross-sectional views illustrating fabrication of a MIM capacitor according to a first embodiment of the present invention;

FIGS. 4A through 4E are cross-sectional views illustrating fabrication of a MIM capacitor according to a second embodiment of the present invention;

FIGS. 5A through 5F are cross-sectional views illustrating fabrication of a MIM capacitor according to a third embodiment of the present invention;

FIGS. 7A through 7F are cross-sectional views illustrating fabrication of a MIM capacitor according to a fifth embodiment of the present invention.

DETAILED DESCRIPTION

Figure 1A:
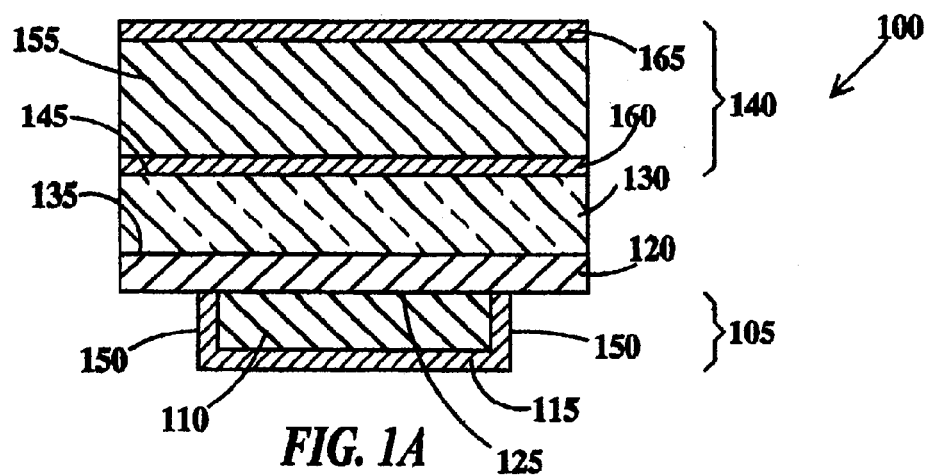
FIG. 1A, is a cross-sectional view of an exemplary MIM capacitor according to the present invention.

FIG. 1A, is a cross-sectional view of an exemplary MIM capacitor 100 according to the present invention. In FIG. 1A, MIM capacitor 100 includes a bottom electrode 105 comprising a copper core conductor 110 and a conductive liner 115. MIM capacitor 100 further includes a conductive diffusion barrier 120 formed on a top surface 125 of bottom electrode 105, a dielectric layer 130 formed on a top surface 135 of conductive diffusion barrier 120 and an exemplary tri-layer top electrode 140 formed on a top surface 145 of MIM dielectric 130. Diffusion barrier 120 is intended to prevent copper diffusion out of bottom electrode 105 as well as prevent formation of CuO by reaction of copper core conductor 110 with MIM dielectric 130 when dielectric MIM 130 includes oxides. Top electrode 140 includes a core conductor 155, an optional bottom conductor 160 and an optional top conductor 165. While in FIG. 1A, conductive diffusion barrier 120 extends past sidewalls 150 of lower electrode 105 this feature does not occur in each and every embodiment of the present invention. The geometrical relationships between bottom electrodes, conductive diffusion barriers, MIM dielectrics and top electrodes are described infra in relationship to each of the various embodiments of the present invention.

In one example, conductive liner 115 comprises Ta, TaN or combinations of layers thereof. In one example, conductive diffusion barrier 120 includes a layer about 5 to 200 nm in thickness of a refractory metal such as W, Ta or TaN, a conductive material such as WN, TaN, TaSiN, Pt, $IrO_2$ or $RuO_2$ or combinations of layers thereof. In one example, MIM dielectric 130 includes a layer about 2 to 20 nm in thickness of $SiO_2$, $Si_3N_4$ or SiC, a high K dielectric such as $Ta_2O_5$, $BaTiO_3$, $HfO_2$, $ZrO_2$ or $Al_2O_3$, or combinations of layers thereof. In one example, top electrode 140 has a thickness of about 50 to 300 nm and core conductor 155 of top electrode 140 comprises Al or W and top and bottom conductors 160 and 165 comprise TiN or TaN. All embodiments of the present invention utilize these materials in MIM capacitors.

Figure 1B:
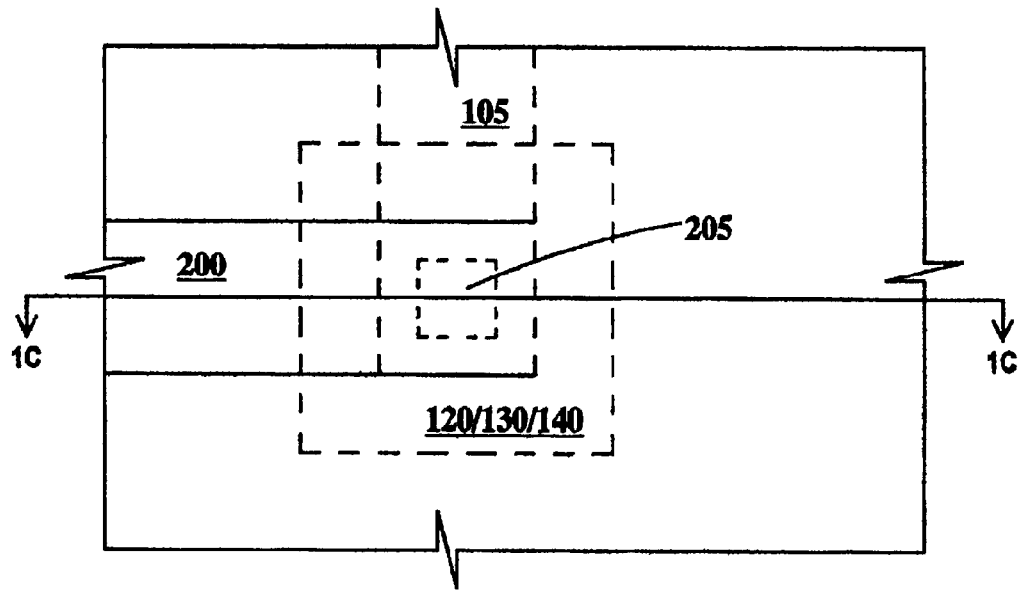
FIG. 1B is a top plan view and FIG. 1C a cross-sectional view through line 1C—1C of FIG. 1B, of an interconnect structure incorporating a MIM capacitor according to the present invention.
Figure 1C:
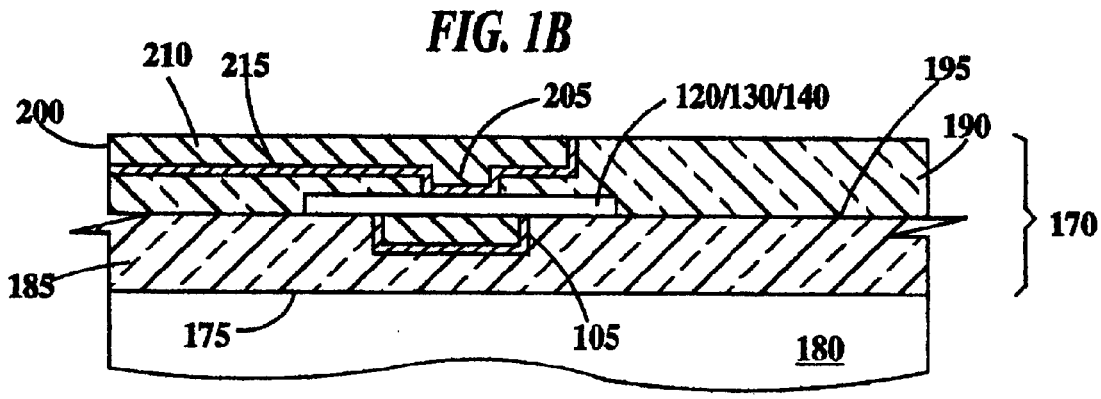

FIG. 1B is a top plan view and FIG. 1C a cross-sectional view through line 1C—1C of FIG. 1B, of an interconnect structure incorporating a MIM capacitor according to the present invention. FIGS. 1B and 1C are exemplary of the integration of the MIM capacitor of the present invention into the damascened wiring levels of an integrated circuit device. An exemplary interlevel dielectric (ILD) stack 170 is formed on a top surface 175 of a semiconductor substrate 180. ILD stack 170 includes a first ILD 185 formed on top surface 175 of substrate 180 and a second ILD 190 formed on a top surface 195 of second ILD 190. Formed in first ILD 185 is bottom electrode 105. Bottom electrode 105 also serves as an electrical wiring connection to the MIM. Formed in second ILD 190 are conductive diffusion barrier 120, dielectric 130 and top electrode 140. Also formed in second ILD 195 is a conductor 200 for electrical connection to top plate 140 of the MIM capacitor through via 205. Conductor 200 and via 205 comprises a copper core 210 and a conductive liner 215.

While two ILD levels are illustrated in FIG. 1C, any number of ILD levels may be used in and integrated circuit device and the MIM capacitor may be physically located in any two adjacent ILD levels, the bottom electrode in the lower of the two ILD levels, the MIM dielectric and top electrode in the upper of the two ILD levels. The conductive diffusion barrier may be located in either the upper or lower ILD level or both. Examples of ILD materials include deposited oxides such as tetraethoxysilane (TEOS), fluoridated silicon oxide glass (FSG) and other chemical-vapor-deposition (CVD) oxides.

Figure 2E:
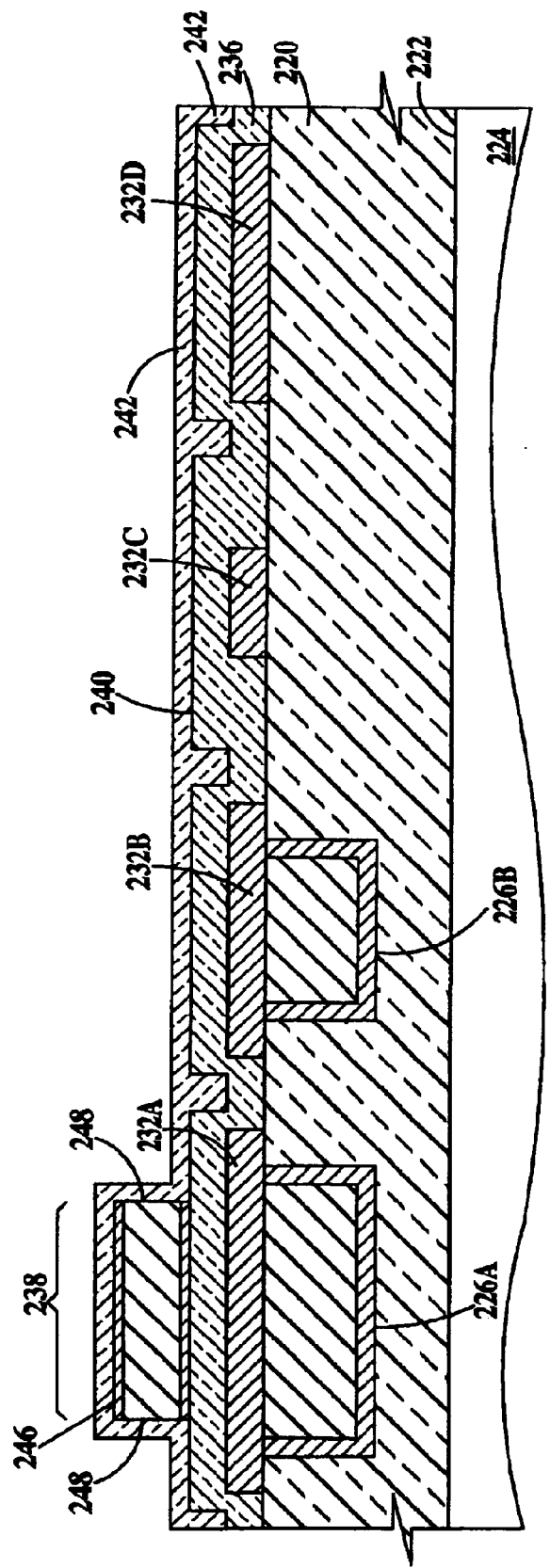

FIGS. 2A through 2F are cross-sectional views illustrating fabrication of a MIM capacitor according to a first embodiment of the present invention. In FIG. 2A, an ILD 220 is formed on a top surface 222 of semiconductor substrate 224. Formed in ILD 220 are a bottom electrode 226A and a conductor 226B. Bottom electrode 226A includes a copper core conductor 228A and a conductive liner 230A. Conductor 226B includes a copper core conductor 228B and a conductive liner 230B. Conductive liner and ILD materials have been described supra. Bottom electrode 226A and conductor 226B are formed by a damascene process. In a damascene process, trenches are formed in an ILD by photo-lithographically patterning a masking layer applied over the ILD, performing a reactive ion etch (RIE) of the ILD, removing the masking layer, depositing a conductive liner, depositing a copper seed layer deposition, copper plating to fill the trench and performing a chemical-mechanical-polish (CMP) process to co-planarize the top surfaces of the copper and conductive liner and ILD. Bottom electrode 226A will become the bottom electrode of a MIM capacitor and conductor 226B is a typical interconnect conductor.

In FIG. 2B, a conductive diffusion barrier layer is deposited, photo-lithographically patterned and an RIE process performed to form conductive diffusion barriers 232A and 232B, a resistor 232C and an alignment mark 232D on a top surface 234 of ILD 220. Note conductive diffusion barriers 232A and 232B overlap first and second conductors 226A and 226B respectively. Conductive diffusion barrier materials and thicknesses have been described supra.

In FIG. 2C, a blanket MIM dielectric layer 236 is deposited. MIM dielectric materials and thicknesses have been described supra.

In FIG. 2D, an exemplary triple-layer conductor is deposited photo-lithographically patterned and RIE etched to form an exemplary tri-layer top electrode 238 on a top surface 240 of MIM dielectric layer 236. Top electrode 238 is aligned over conductive diffusion barrier 232A and bottom electrode 226A. Top electrode 238 negatively overlaps (i.e. is smaller than) conductive diffusion barrier 232A. Top electrode materials and thicknesses have been described supra.

In FIG. 2E, an optional RIE stop layer 242 is deposited on top surface 240 of MIM dielectric layer 236 and on a top surface 246 and sidewalls 248 of top electrode 238. In one example, RIE stop layer 242 has a thickness of about 5 to 50 nm and comprises $Si_3N_4$.

Figure 2F:
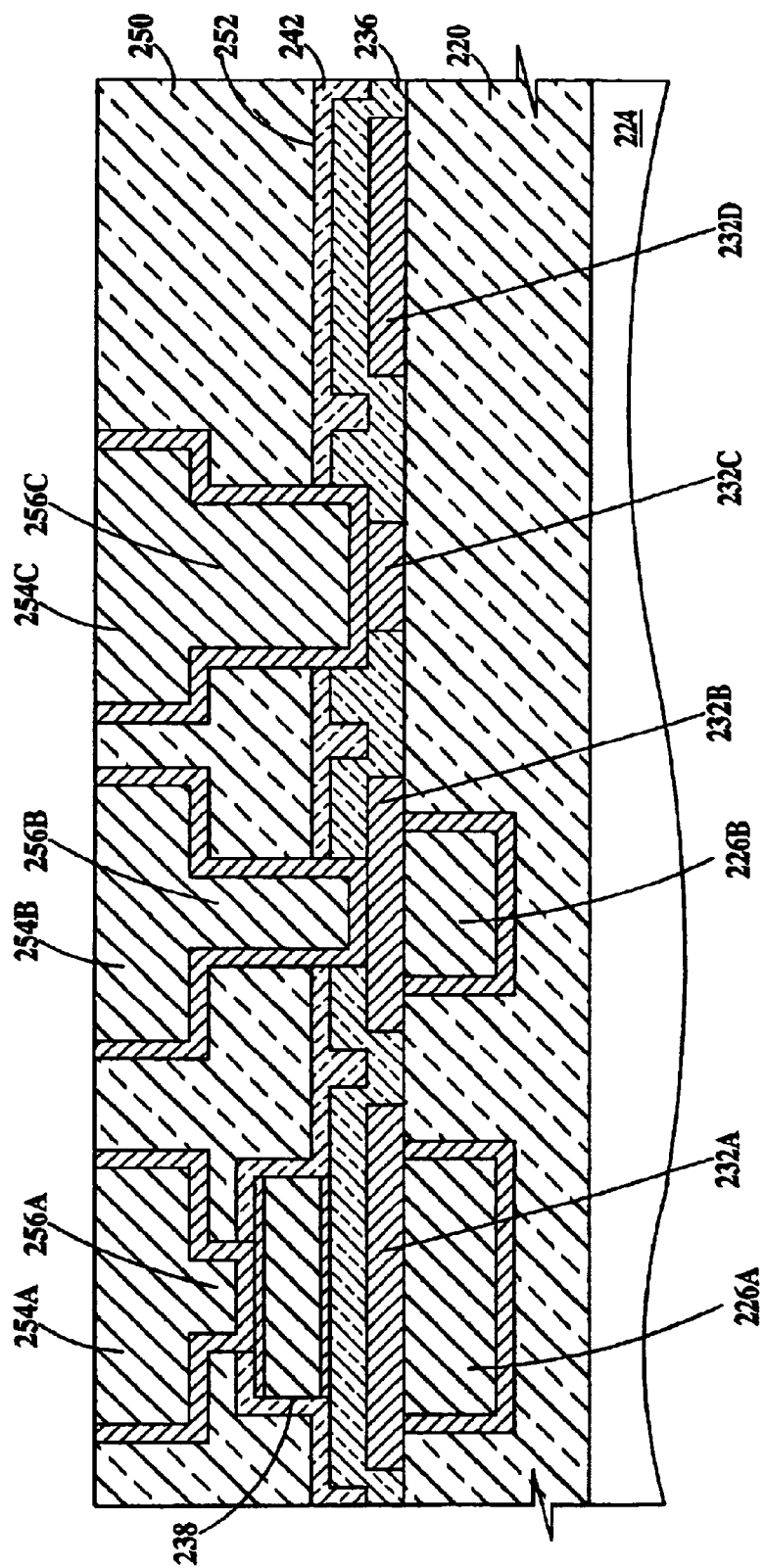

In FIG. 2F, a second ILD layer 250 is deposited on a top surface 252 of RIE stop layer 242. Conductors 254A, 254B and 254C having integral vias 256A, 256B and 256C respectively are formed to electrically contact top electrode 238, conductor 226B and resistor 232C respectively, through RIE stop layer 242. Conductors 254A, 254B and 254C are formed by a dual damascene process. In a dual damascene process, conductors are formed in an ILD by photo-lithographically patterning a first masking layer applied over the ILD, performing an RIE of the ILD to etch trenches in the ILD, removing the first masking layer, photo-lithographically patterning a second masking layer applied over the ILD and trenches, performing an RIE of the ILD to etch vias in the bottom of the trenches, removing the second masking layer, depositing a conductive liner, depositing a copper seed layer deposition, copper plating to fill the trench and performing a CMP process to co-planarize the surfaces of the copper and the conductive liner and ILD.

While two ILD levels are illustrated in FIG. 2F, any number of ILD levels may be used in an integrated circuit device and the MIM capacitor may be physically located in any two adjacent ILD levels, the bottom electrode in the lower of the two ILD levels and the conductive diffusion barrier, MIM dielectric and top electrode in the upper of the two ILD levels.

Figure 3A:
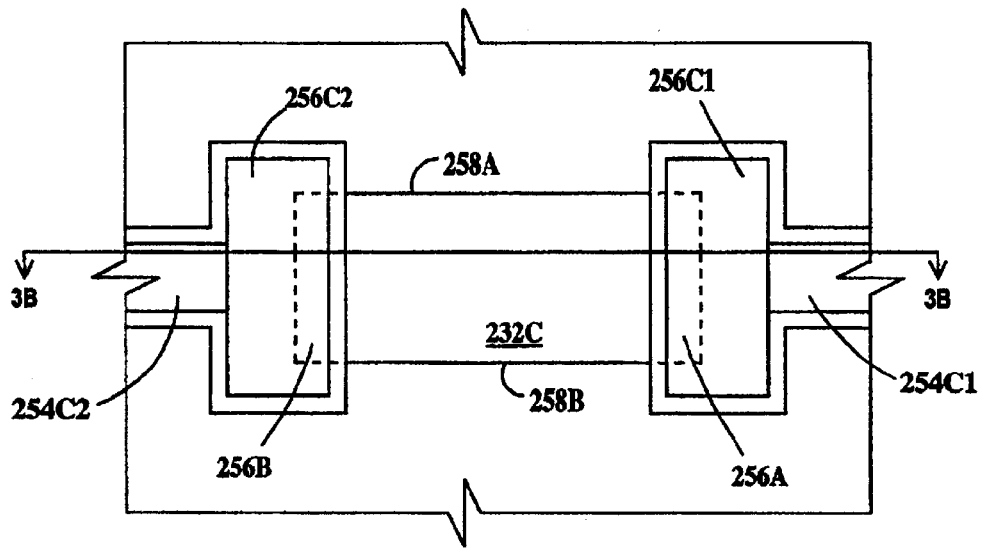
FIG. 3A is a top view and FIG. 3B is a cross-sectional view through line 3B—3B of FIG. 3A, of the contact to a resistor according to the present invention.
Figure 3B:
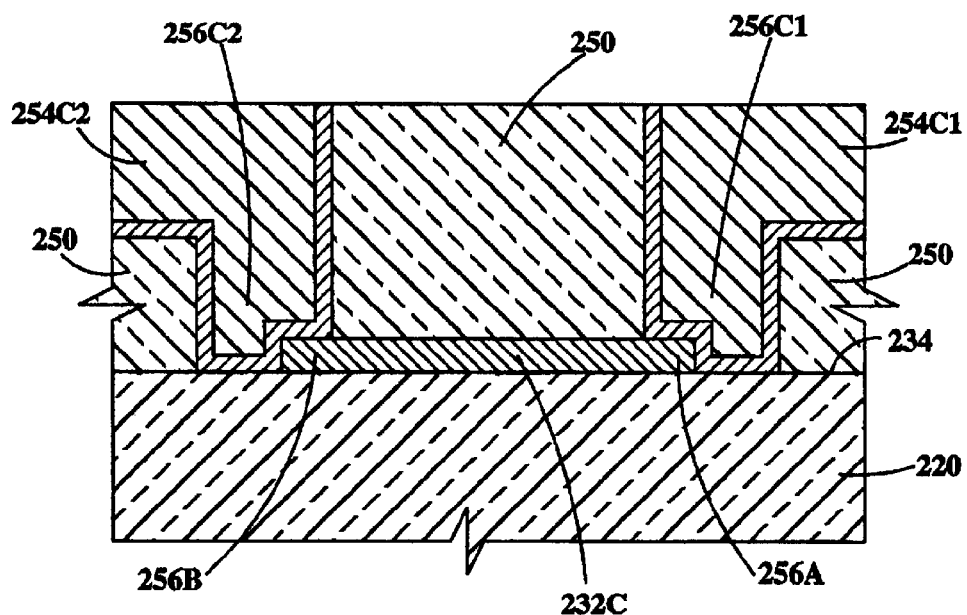

FIG. 3A is a top view and FIG. 3B is a cross-sectional view through line 3B—3B of FIG. 3A, of the contact to resistor 232C according to the present invention. A first conductor 254C1 electrically contacts a first end 256A of resistor 232C and a second conductor 254C2 electrically contacts a second end 256B of the resistor. Vias 256C1 and 256C2 overlap, respectively, ends 256A and 256B as well as portions of sides 258A and 258B adjacent to the ends of resistor 232C.

Figure 4C:
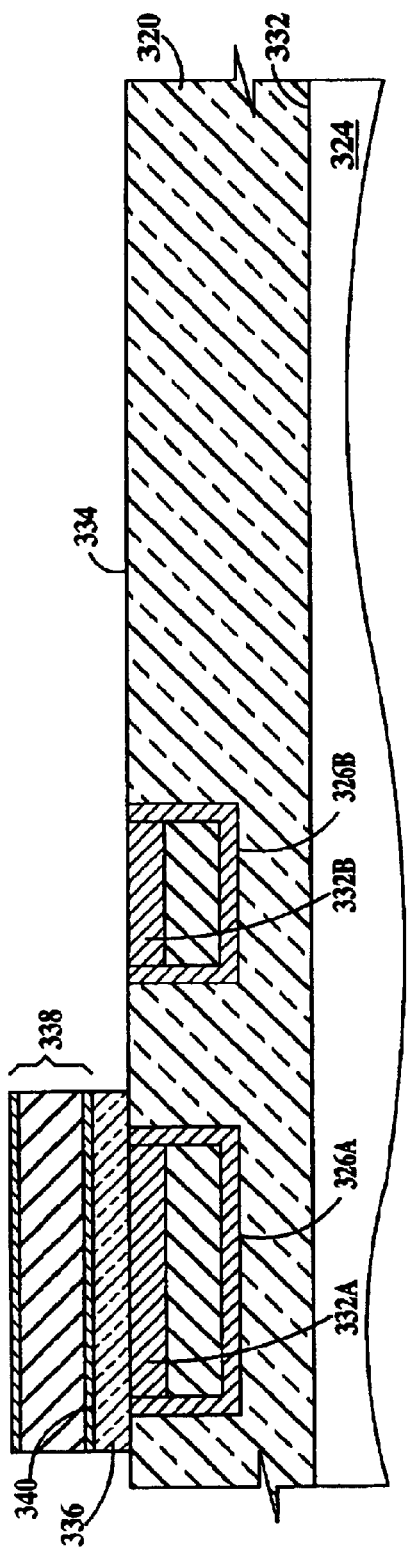

FIGS. 4A through 4E are cross-sectional views illustrating fabrication of a MIM capacitor according to a second embodiment of the present invention. In FIG. 4A, an ILD 320 is formed on a top surface 322 of semiconductor substrate 324. Formed in ILD 320 are a bottom electrode 326A and a conductor 328A. Bottom electrode 326A includes a copper core conductor 328A and a conductive liner 330A. Conductor 326B includes a copper core conductor 328B and a conductive liner 330B. Conductive liner and ILD materials have been described supra. Bottom electrode 326A and conductor 326B are formed by a damascene process as describes supra. Bottom electrode 326A will become the bottom electrode of a MIM capacitor and conductor 326B is a typical interconnect conductor.

In FIG. 4B, core conductors 328A and 328B are recessed by a wet process or an RIE process. A conductive diffusion barrier layer is deposited on ILD 320 of sufficient thickness to fill the recesses formed by the core etching process and a CMP process performed to form recessed conductive diffusion barriers 332A and 332B and co-planarize the conductive diffusion barriers with a top surface 334 of ILD 320. Diffusion barrier materials and thicknesses have been described supra.

In FIG. 4C, a MIM dielectric 336 and an exemplary tri-layer top electrode 338 (on a top surface 340 of the MIM dielectric) are formed by deposition of a MIM dielectric layer on top surface 334 of ILD 320 as well as over conductive diffusion barriers 326A and 326B, deposition of an exemplary triple layer conductive layer over a top surface of the MIM dielectric layer, photo-lithographically patterning a masking layer applied over the conductive layer to define the extent of MIM dielectric 336 and top electrode 338, performing an RIE of the MIM dielectric layer and the conductive layer, and removing the masking layer. Top electrode 338 is aligned over recessed conductive diffusion barrier 332A and bottom electrode 326A. Top electrode 338 positively overlaps (i.e. is larger than) recessed conductive diffusion barrier 332A. Conductive diffusion barrier materials and thicknesses, MIM dielectric materials and thicknesses and top electrode materials and thicknesses have been described supra.

Figure 4D:
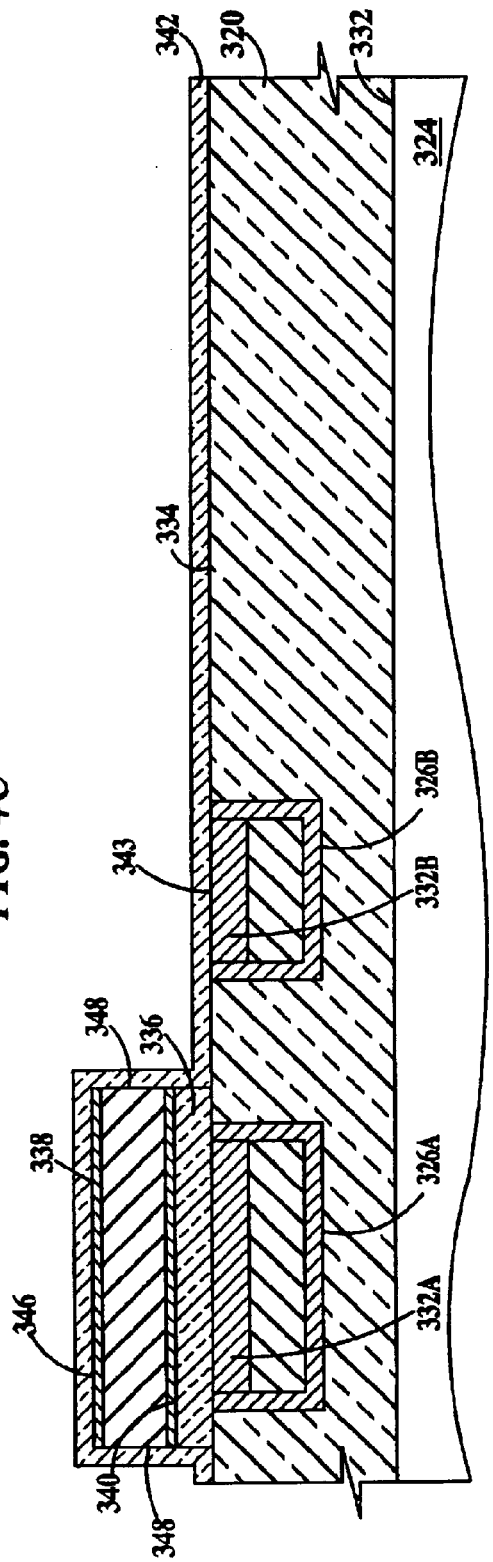

In FIG. 4D, an optional RIE stop layer 342 is deposited on a top surface 346 and sidewalls 348 of top electrode 338, exposed top surface 334 of ILD 320 and a top surface 343 of recessed conductive diffusion barrier 332B. In one example, RIE stop layer 342 has a thickness of about 5 to 50 nm and comprises $Si_3N_4$.

Figure 4E:
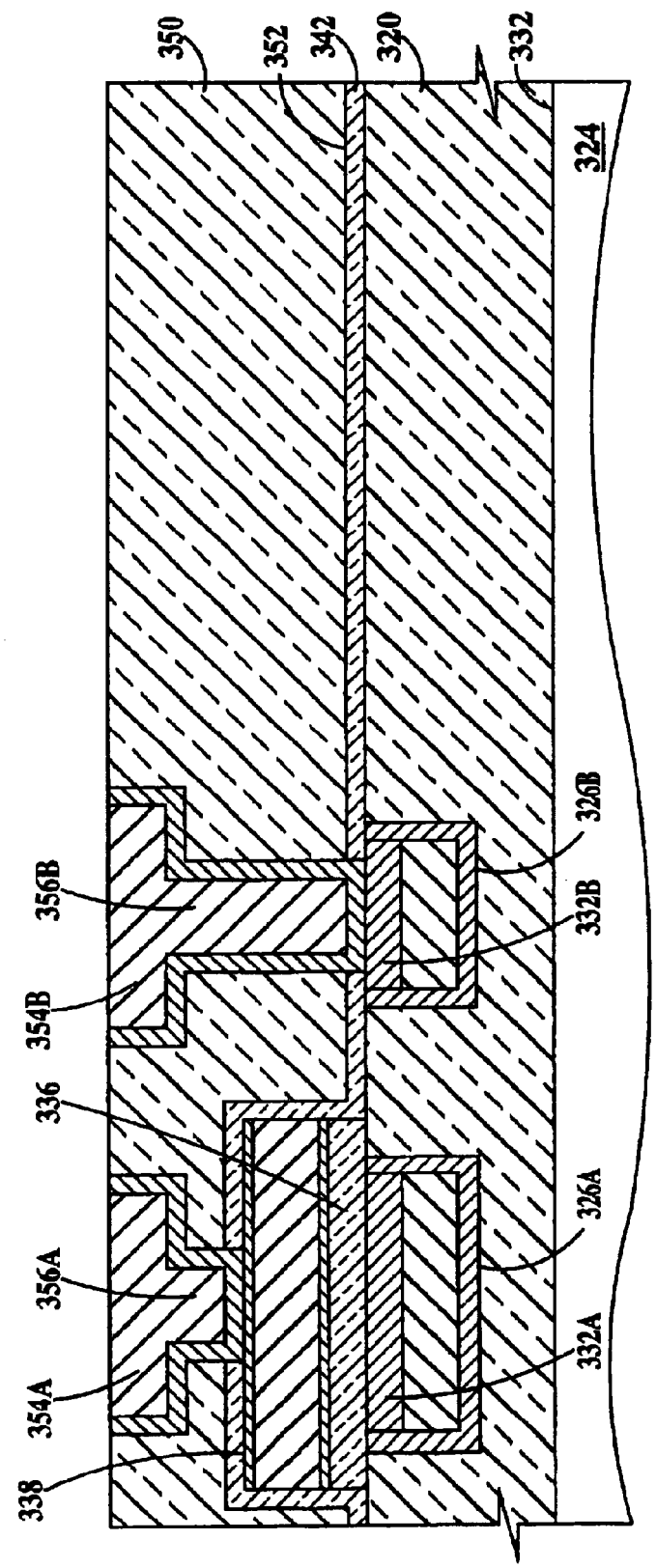

In FIG. 4E, a second ILD layer 350 is deposited on a top surface 352 of RIE stop layer 342. Conductors 354A and 354B having integral vias 356A and 356B respectively are formed to electrically contact top electrode 338, and recessed conductive diffusion barrier 332B respectively, through RIE stop layer 342. Conductors 354A and 354B are formed by a dual damascene process as described supra.

While two ILD levels are illustrated in FIG. 4E, any number of ILD levels may be used in an integrated circuit device and the MIM capacitor may be physically located in any two adjacent ILD levels, the bottom electrode in the lower of the two ILD levels and the conductive diffusion barrier, MIM dielectric and top electrode in the upper of the two ILD levels.

Figure 5C:
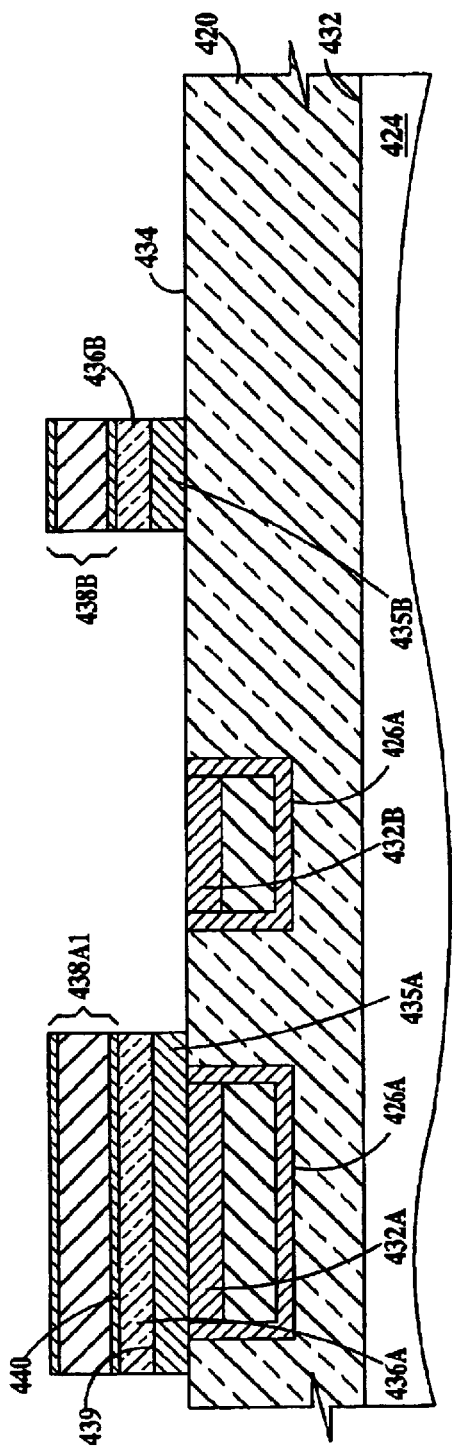

FIGS. 5A through 5F are cross-sectional views illustrating fabrication of a MIM capacitor according to a third embodiment of the present invention. In FIG. 5A, an ILD 420 is formed on a top surface 422 of semiconductor substrate 424. Formed in ILD 420 are a bottom electrode 426A and a conductor 426B. Bottom electrode 426A includes a copper core conductor 428A and a conductive liner 430A. Conductor 426B includes a copper core conductor 428B and a conductive liner 430B. Conductive liner and ILD materials have been described supra. Bottom electrode 426A and conductor 426B are formed by a damascene process as describes supra. Bottom electrode 426A will become the bottom electrode of a MIM capacitor and conductor 426B is a typical interconnect conductor.

In FIG. 5B, core conductors 428A and 428B are recessed by a wet process or an RIE process. A first conductive diffusion barrier layer is deposited on ILD 420 of sufficient thickness to fill the recesses formed by the etch process and a CMP process performed to form recessed conductive diffusion barriers 432A and 432B and co-planarize the recessed conductive diffusion barriers with a top surface 434 of ILD 420. Conductive diffusion barrier materials and thicknesses have been described supra.

In FIG. 5C, an upper conductive diffusion barrier 435A, a resistor 435B, a MIM dielectric 436A and an exemplary tri-layer top electrode 438A1 (on a top surface 440 of the MIM dielectric) and an exemplary tri-layer cap 438B are formed as follows: First, a second conductive diffusion barrier layer is deposited on top surface 434 of ILD 420 as well as over recessed conductive diffusion barriers 432A and 432B. Second, a MIM dielectric layer is deposited on top a surface of the second conductive diffusion barrier layer and an exemplary triple-layer conductive layer is deposited on a top surface of the second conductive diffusion barrier layer. Third, a masking layer applied over the conductive layer is photo-lithographically patterned to define the extent of MIM dielectric 436A, the extent of upper conductive diffusion barrier 435A and resistor 435B, and an initial extent of top electrode 438A1 and the extent of cap 438B. Fourth, an RIE of the MIM dielectric layer, second conductive diffusion barrier layer and the conductive layer is performed and the masking layer removed. Conductive diffusion barrier materials and thicknesses have been described supra.

Figure 5D:
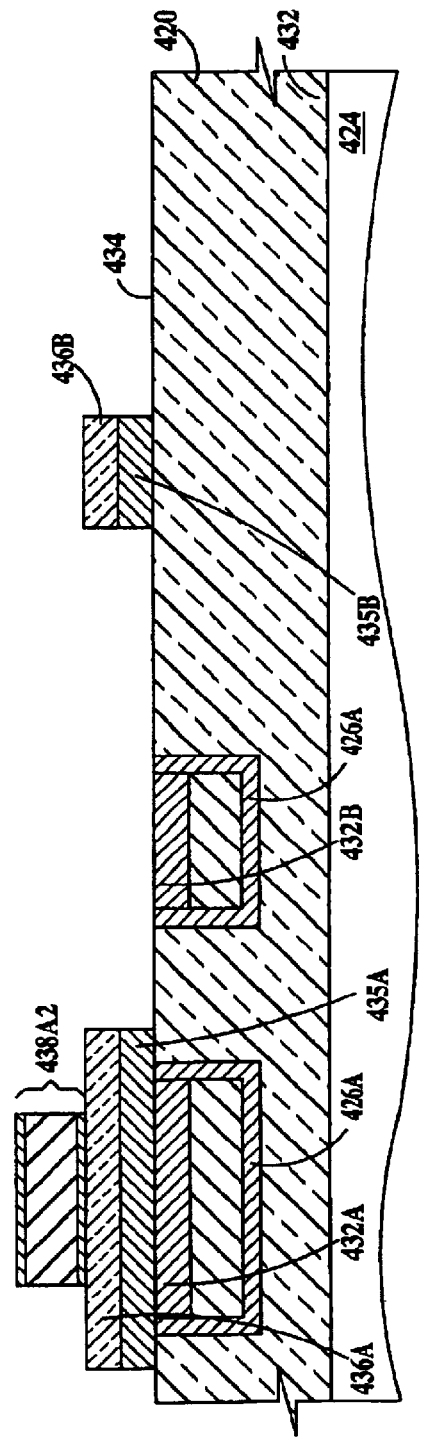

In FIG. 5D, a masking layer applied, is photo-lithographically patterned and an RIE performed to define the final extent of top electrode 438A2 as well as to remove cap 438B (see FIG. 5C) from over MIM dielectric 436B. The masking layer is then removed. Top electrode 438A2 is aligned over recessed conductive diffusion barrier 432A and upper conductive diffusion barrier 435A and bottom electrode 426A. Top electrode 438 A2 negatively overlaps (i.e. is smaller than) upper conductive diffusion barrier 435A. Upper conductive diffusion barrier 435A positively overlaps (i.e. is larger than) recessed conductive diffusion barrier 432A. MIM dielectric materials and thicknesses and top electrode materials and thicknesses have been described supra.

Figure 5E:
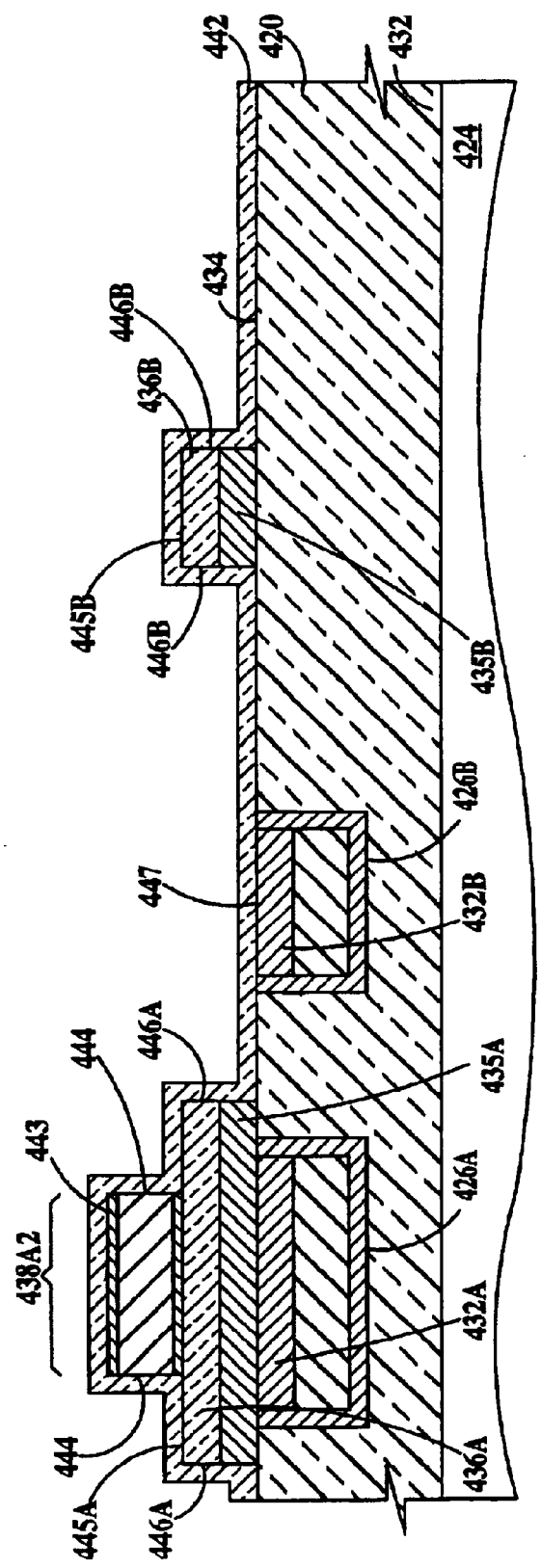

In FIG. 5E, an optional RIE stop layer 442 is deposited on a top surface 443 and sidewalls 444 of top electrode 438A2, a top surface 445A and sidewalls 446A of MIM dielectric 436A/upper conductive diffusion barrier 435A, top surface 445B and sidewalls 446B of MIM dielectric 436B/resistor 435B, exposed top surface 434 of ILD 420, and a top surface 447 of recessed conductive diffusion barrier 432B. In one example, RIE stop layer 442 has a thickness of about 5 to 50 nm and comprises $Si_3N_4$.

Figure 5F:
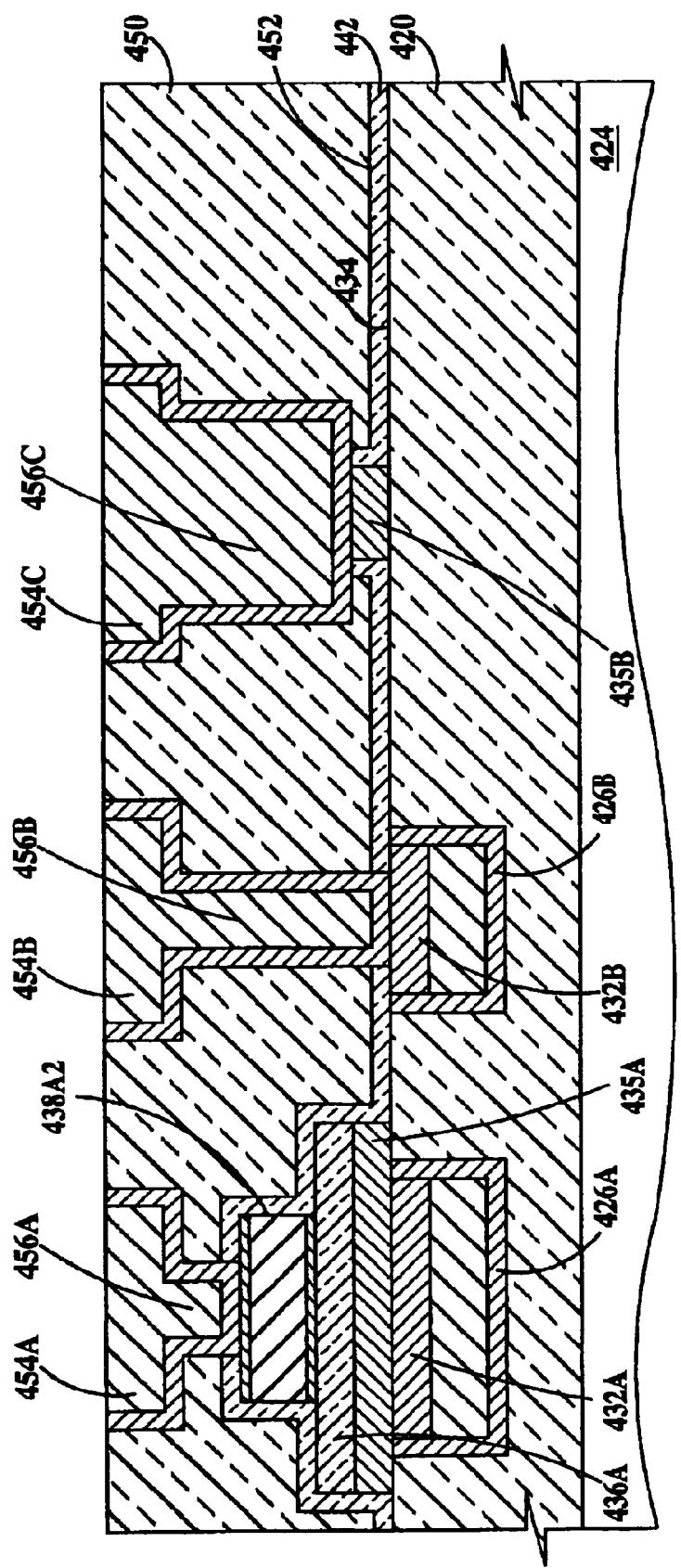

In FIG. 5F, a second ILD layer 450 is deposited on a top surface 452 of RIE stop layer 442. Conductors 454A, 454B and 454C having integral vias 456A, 456B and 456C respectively are formed to electrically contact top electrode 438A2, recessed conductive diffusion barrier 432B and resistor 435B respectively, through RIE stop layer 442. Conductors 454A and 454B are formed by a dual damascene process as described supra. While two ILD levels are illustrated in FIG. 5F, any number of ILD levels may be used in an integrated circuit device and the MIM capacitor may be physically located in any two adjacent ILD levels, the bottom electrode in the lower of the two ILD levels and the conductive diffusion barrier, MIM dielectric and top electrode in the upper of the two ILD levels.

Figure 6A:
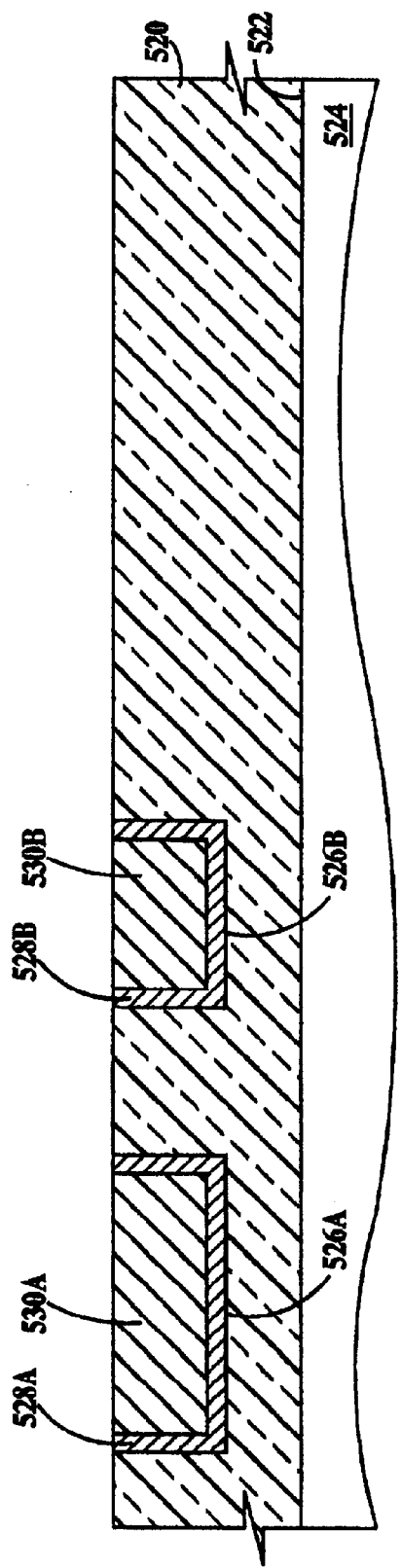
FIGS. 6A through 6F are cross-sectional views illustrating fabrication of a MIM capacitor according to a fourth embodiment of the present invention.

FIGS. 6A through 6F are cross-sectional views illustrating fabrication of a MIM capacitor according to a fourth embodiment of the present invention. In FIG. 6A, an ILD 520 is formed on a top surface 522 of semiconductor substrate 524. Formed in ILD 520 are a bottom electrode 526A and a conductor 526A. Bottom electrode 526A includes a copper core conductor 528A and a conductive liner 530A. Conductor 526B includes a copper core conductor 528B and a conductive liner 530B. Conductive liner and ILD materials have been described supra. Bottom electrode 526A and conductor 526B are formed by a damascene process as described supra. Bottom electrode 526A will become the bottom electrode of a MIM capacitor and conductor 526B is a typical interconnect conductor.

Figure 6B:
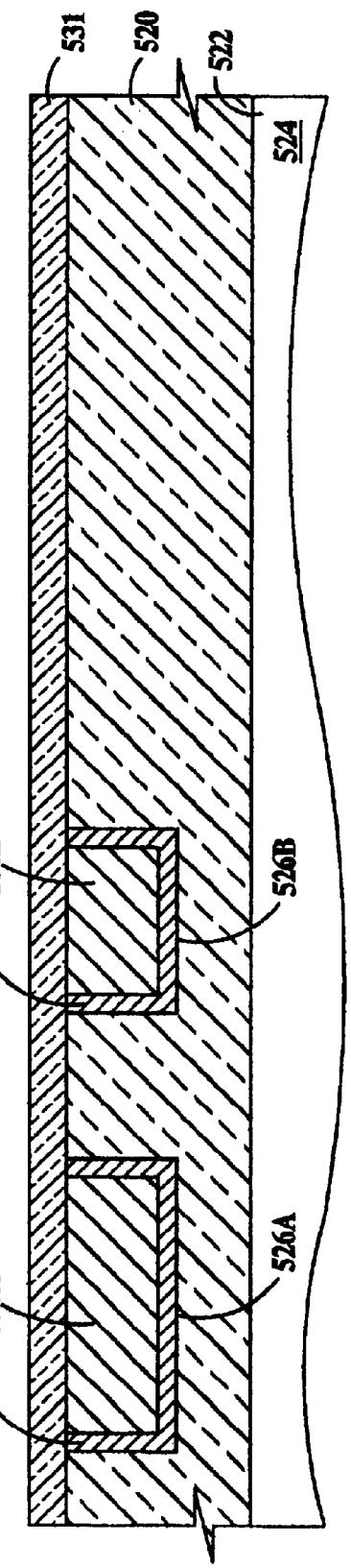

In FIG. 6B, a dielectric diffusion barrier layer 531 is formed on top of ILD 520, bottom electrode 526A and conductor 526B by deposition. Examples of suitable materials for dielectric diffusion barrier 531 include $Si_3N_4$, SiC, $SiO_2$ over $Si_3N_4$ and FSG over Si3N4 having a thickness of about 5 to 50 nm.

Figure 6C:
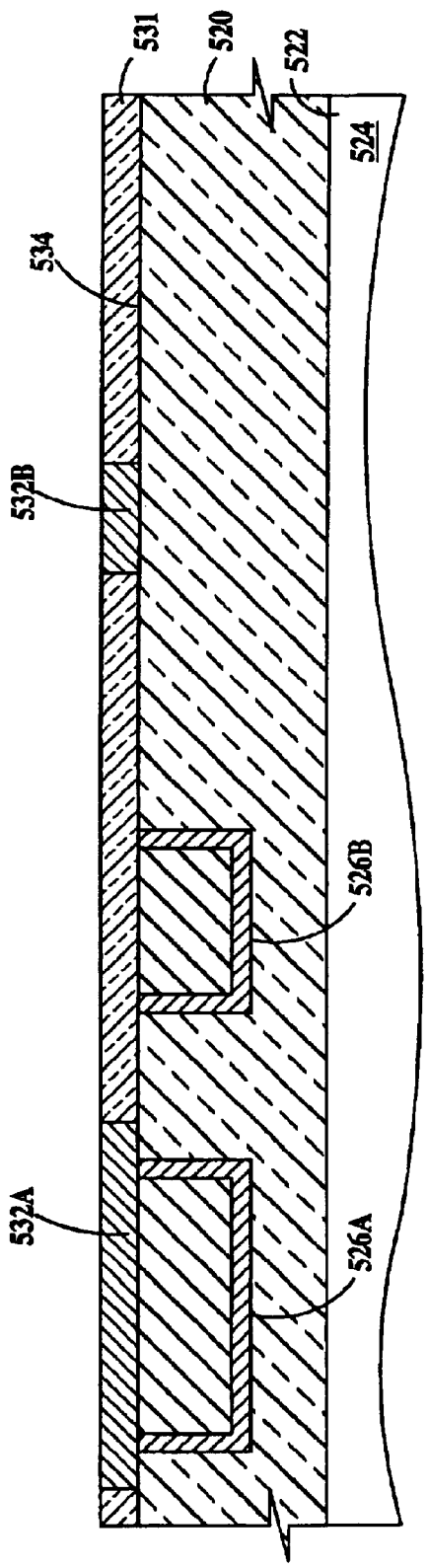

In FIG. 6C, a conductive diffusion barrier 532A is formed over bottom electrode 526A (and overlapping ILD 520) and a resistor 532B is formed on a top surface 534 of ILD 520 by a damascene process as described supra. Diffusion barrier materials and thicknesses have been described supra.

Figure 6D:
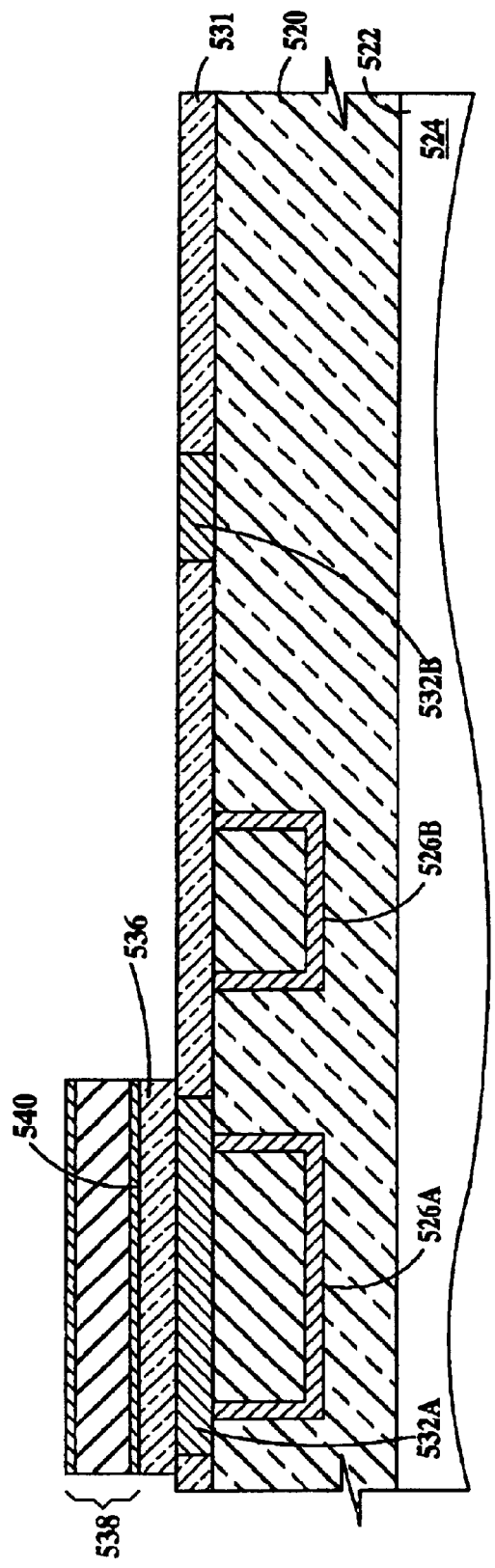

In FIG. 6D, first a MIM dielectric layer and then an exemplary triple layer conductive layer are deposited, photo-lithographically patterned and RIE etched to form an exemplary tri-layer top electrode 538 on a top surface 540 of a MIM dielectric 536. Top electrode 538 is aligned over conductive diffusion barrier 532A and bottom electrode 526A. Top electrode 538 positively overlaps (i.e. is larger than) conductive diffusion barrier 532A. Conductive diffusion barrier 532A positively overlaps (i.e. is larger than) lower electrode 526A. MIM dielectric materials and thicknesses and top electrode materials have been described supra.

Figure 6E:
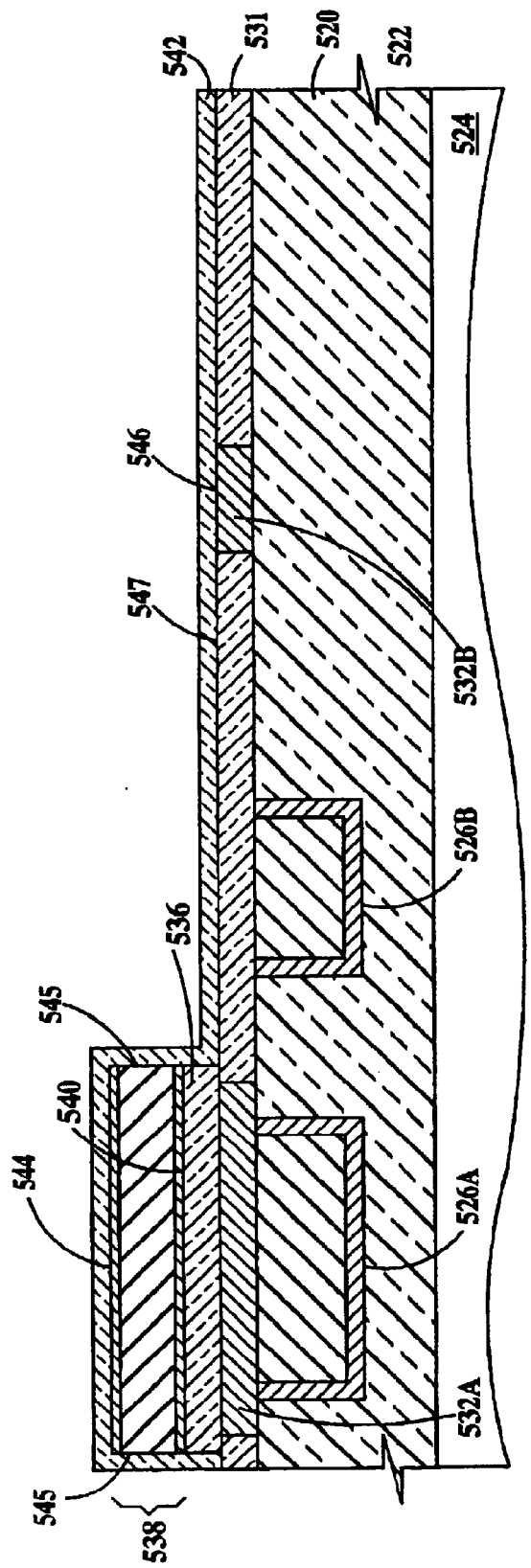

In FIG. 6E, an optional RIE stop layer 542 is deposited on top surface 544 of top electrode 538 and sidewalls 545 of top electrode 538/MIM dielectric 536 and on a top surface 546 of resistor 532B and a top surface 547 of dielectric diffusion barrier 531. In one example, RIE stop layer 542 has a thickness of about 5 to 50 nm and comprises $Si_3N_4$.

Figure 6F:
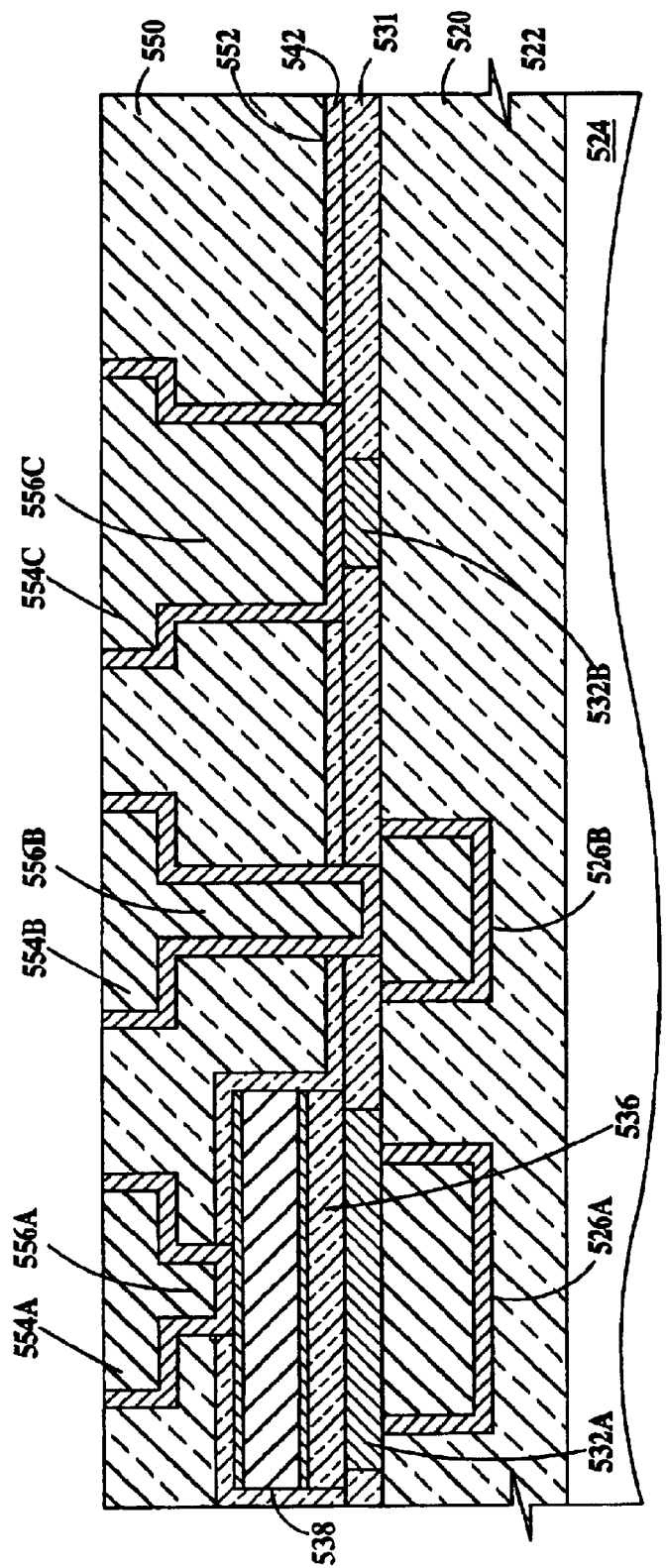

In FIG. 6F, a second ILD layer 550 is deposited on a top surface 552 of RIE stop layer 542. Conductors 554A, 554B and 554C having integral vias 556A, 556B and 556C respectively are formed to electrically contact top electrode 538, conductor 526B and resistor 532B respectively, through RIE stop layer 542. Conductors 554A, 554B and 554C are formed by a dual damascene process as described supra.

While two ILD levels are illustrated in FIG. 6F, any number of ILD levels may be used in an integrated circuit device and the MIM capacitor may be physically located in any two adjacent ILD levels, the bottom electrode in the lower of the two ILD levels and the conductive diffusion barrier, MIM dielectric and top electrode in the upper of the two ILD levels.

Figure 7A:
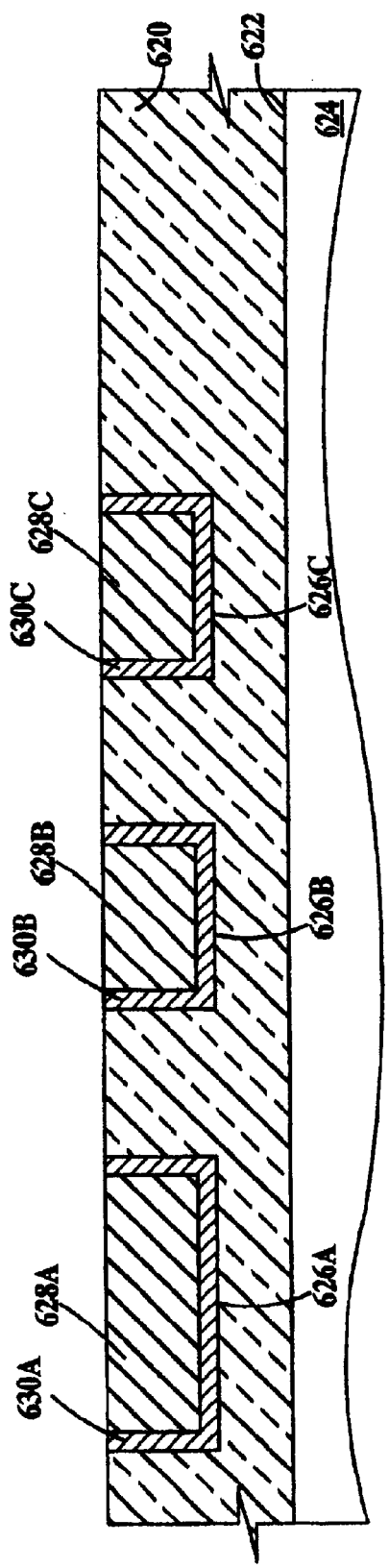

FIGS. 7A through 7F are cross-sectional views illustrating fabrication of a MIM capacitor according to a fifth embodiment of the present invention. In FIG. 7A, an ILD 620 is formed on a top surface 622 of semiconductor substrate 624. Formed in ILD 620 are a bottom electrode 626A, a conductor 626B and a resistor contact 626C. Bottom electrode 626A includes a copper core conductor 628A and a conductive liner 630A. Conductor 626B includes a copper core conductor 628B and a conductive liner 630B. Resistor contact 626C includes a copper core conductor 628C and a conductive liner 630C. Conductive liner and ILD materials have been described supra. Bottom electrode 626A, conductor 626B and resistor contact 626C are formed by a damascene process as describes supra. Bottom electrode 626A will become the bottom electrode of a MIM and conductor 626B is a typical interconnect conductor.

Figure 7B:
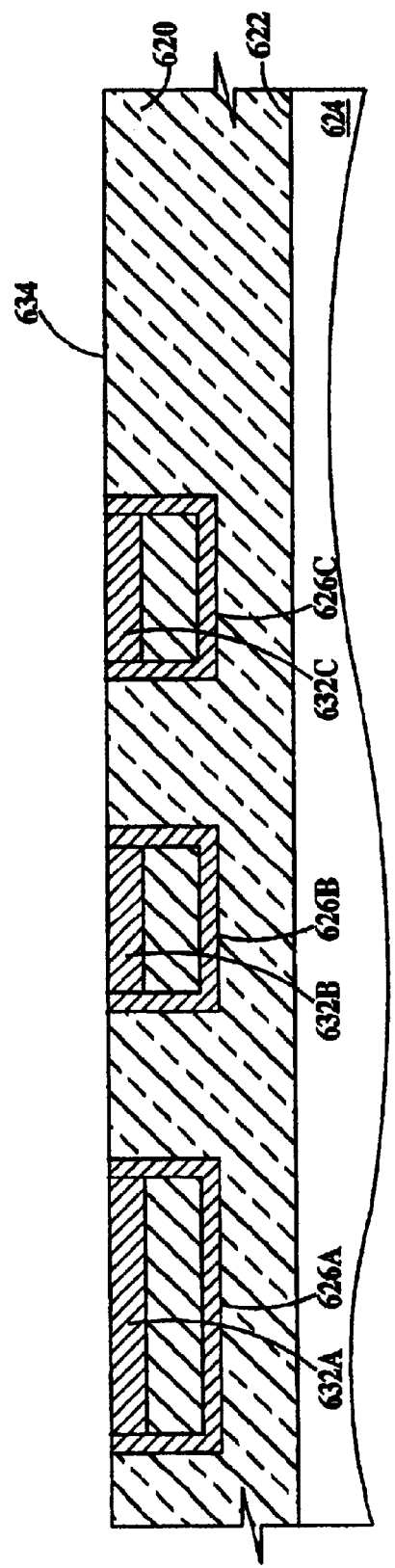

In FIG. 7B, core conductors 628A, 628B and 628C are recessed by a wet process or an RIE process, a first conductive diffusion barrier layer is deposited on ILD 620 of sufficient thickness to fill the recesses formed by the etch process and a CMP process performed to form recessed conductive diffusion barriers 632A, 632B and 632C and co-planarize the recessed conductive diffusion barriers with a top surface 634 of ILD 620. Conductive diffusion barrier materials and thicknesses have been described supra.

In FIG. 7C, an upper conductive diffusion barrier 635A, a resistor 635B, and an alignment mark 635C are formed by depositing a conductive diffusion barrier layer on top surface 634 of ILD 620, photo-lithographically patterning a masking layer applied to the conductive diffusion barrier layer, performing an RIE process and removing the masking layer. Conductive diffusion barrier materials and thicknesses have been described supra.

In FIG. 7D, a MIM dielectric 636A covering upper conductive diffusion barrier 635A, an exemplary tri-layer top electrode 638A covering MIM dielectric 636A and dielectric cap 636B covering resistor 635B and an exemplary tri-layer conductive cap 638B covering dielectric cap 636B are formed as follows: First, a MIM dielectric layer is deposited over upper conductive diffusion barrier 635A, resistor 635B, alignment mark 635C and exposed top surface 634 of ILD 620. Second, a masking layer is applied over MIM dielectric layer and photo-lithographically patterned to define the extent of MIM dielectrics 636A and 636B, an RIE of the MIM dielectric layer is performed and the masking layer removed. Third, an exemplary triple-layer conductive layer is deposited over MIM dielectrics 636A and 636B, alignment mark 635C and exposed top surface 634 of ILD 620. Fourth, a masking layer is applied over the conductive layer to define the extent of a top electrode 638A and a conductive cap 636B, an RIE of the conductive layer is performed and the masking layer removed. Top electrode 638 is aligned over MIM dielectric 636A and MIM dielectric is aligned over upper conductive diffusion barrier 635A and bottom electrode 626A. Top electrode 638A positively overlaps (i.e. is larger than) MIM dielectric 636A and MIM dielectric 636A positively overlaps (i.e. is larger than) upper conductive diffusion barrier 635A. MIM dielectric materials and thicknesses and top electrode materials and thicknesses have been described supra.

Figure 7E:
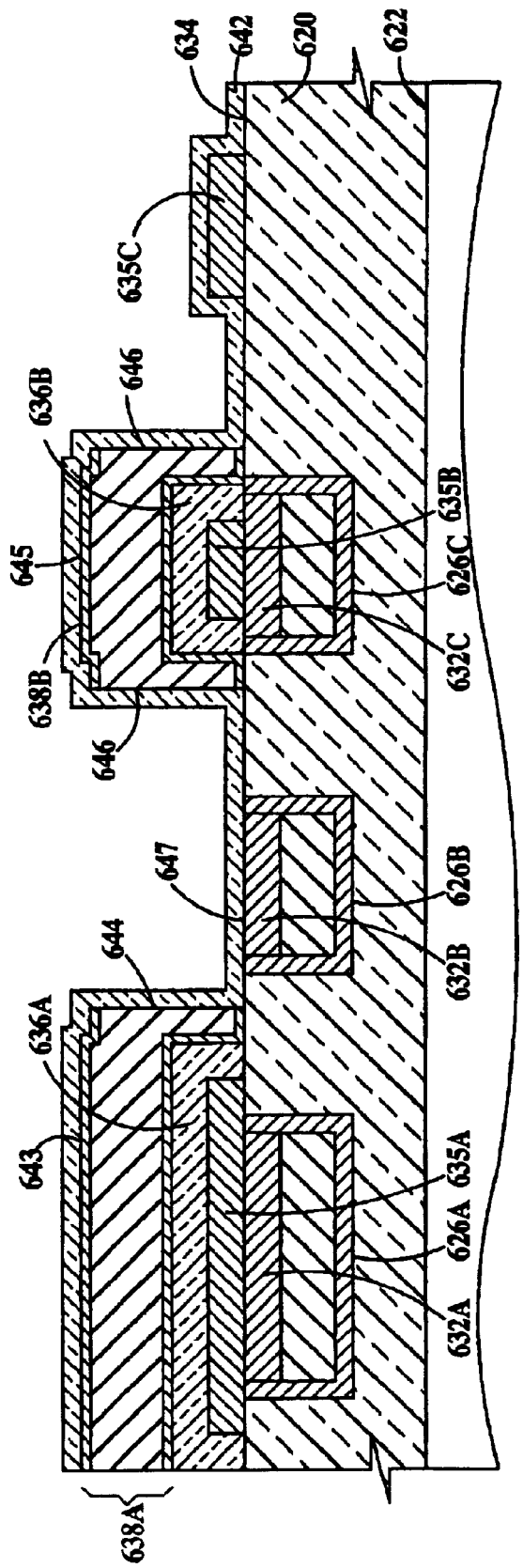

In FIG. 7E, an optional RIE stop layer 642 is deposited on a top surface 643 and sidewalls 644 of top electrode 638A, top surface 645 and sidewalls 646 of conductive cap 636B, exposed top surface 634 of ILD 620, a top surface 647 of recessed conductive diffusion barrier 632B and over alignment mark 635C. In one example, RIE stop layer 642 has a thickness of about 5 to 50 nm and comprises $Si_3N_4$.

Figure 7F:
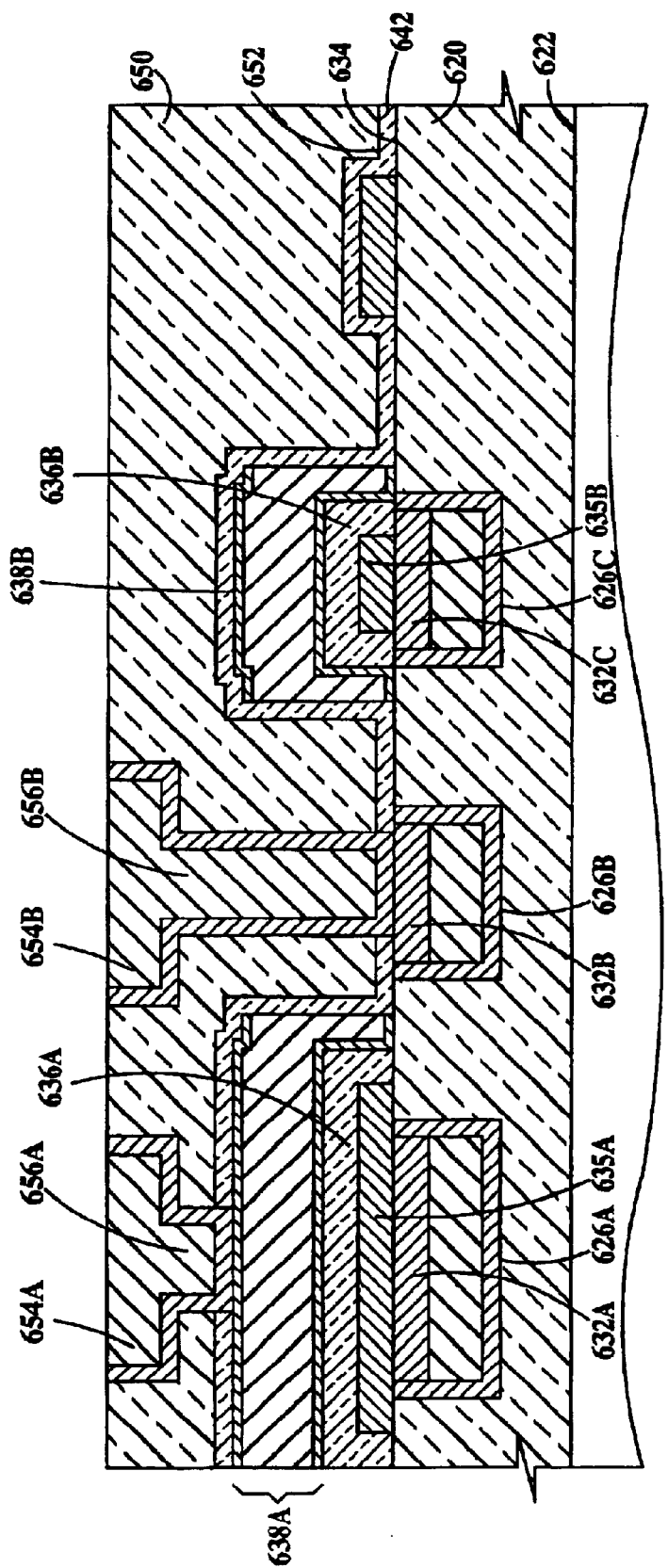

In FIG. 7F, a second ILD layer 650 is deposited on a top surface 652 of RIE stop layer 642. Conductors 654A and 654B having integral vias 656A and 656B respectively are formed to electrically contact top electrode 638A and recessed conductive diffusion barrier 632B through RIE stop layer 642 respectively. Conductors 654A and 654B are formed by a dual damascene process as described supra.

While two ILD levels are illustrated in FIG. 7F, any number of ILD levels may be used in an integrated circuit device and the MIM capacitor may be physically located in any two adjacent ILD levels, the bottom electrode in the lower of the two ILD levels and the conductive diffusion barrier, MIM dielectric and top electrode in the upper of the two ILD levels.

Thus, the present invention provides a MIM structure and fabrication method compatible with copper interconnection technology as well as compatible resistor and alignment mark structures.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. An electronic device, comprising:
   an interlevel dielectric layer formed on a semiconductor substrate;

a copper bottom electrode formed in said interlevel dielectric layer, a top surface of said copper bottom electrode recessed below a top surface of said interlevel dielectric layer;

a first conductive diffusion barrier formed on a top surface of said copper bottom electrode, a top surface of said first conductive diffusion barrier co-planar with said top surface of said interlevel dielectric layer;

a second conductive diffusion barrier in direct contact with said top surface of said first conductive diffusion barrier;

a MIM dielectric in direct contact with a top surface of said second conductive diffusion barrier; and a top electrode in direct contact with a top surface of said MIM dielectric.

2. The electronic device of claim 1, wherein said second conductive diffusion barrier and said MIM dielectric both extend past at least two sides of said first conductive diffusion barrier.

3. The electronic device of claim 1, further including:

a dielectric diffusion barrier layer formed on said top surface of said interlevel dielectric layer; and wherein said top surface of said conductive diffusion barrier is co-planer with a top surface of said dielectric diffusion barrier layer.

4. The electronic device of claim 1, wherein said first and second conductive diffusion barriers each independently comprise about 5 to 200 nm of a refractory metal, W, Ta, TaN, WN, TaN, TaSiN, Pt, $IrO_2$ or $RuO_2$ or combinations thereof.

5. The electronic device of claim 1, wherein said MIM dielectric comprises about 2 to 20 nm of $SiO_2$, $Si_3N_4$ or SiC, a high K dielectric, $Ta_2O_5$, $BaTiO_3$, $HfO_2$, $ZrO_2$ or $Al_2O_3$, or combinations of layers thereof.

6. The electronic device of claim 1, wherein said top electrode comprises Al or W.

7. The electronic device of claim 1, further including a reactive ion etch stop layer over all exposed surfaces of said conductive diffusion barrier, said MIM dielectric, said interlevel dielectric, and said top electrode where said top electrode is not contacted by a conductor formed in a second interlevel dielectric layer formed over said first interlevel dielectric layer.

8. The electronic device of claim 1, wherein at least two sides of said top electrode do not extend past said first conductive diffusion barrier.

9. A method of fabricating an electronic device, comprising:

(a) providing a semiconductor substrate (b) forming an interlevel dielectric layer on said semiconductor substrate;

(c) forming a copper bottom electrode in said interlevel dielectric layer, a top surface of said copper bottom electrode recessed below a top surface of said interlevel dielectric layer;

(d) forming a first conductive diffusion barrier in direct contact with said top surface of said copper bottom electrode, a top surface of said first conductive diffusion barrier co-planar with said top surface of said interlevel dielectric layer;

(e) forming a second conductive diffusion barrier on a top surface of said first conductive diffusion barrier;

(f) forming a MIM dielectric in direct contact with a top surface of said second conductive diffusion barrier; and (g) forming a top electrode in direct contact with a top surface of said MIM dielectric.

10. The method of claim 9, wherein said second conductive diffusion barrier and said MIM dielectric both extend past at least two sides of said first conductive diffusion barrier.

11. The method of claim 9, further including:

(g) after step (c) forming a dielectric diffusion barrier layer on said top surface of said interlevel dielectric layer; and wherein said top surface of said conductive diffusion barrier is co-planer with a top surface of said dielectric diffusion barrier layer.

12. The method of claim 9, wherein said first and second conductive diffusion barriers each independently comprise about 5 to 200 nm of a refractory metal, W, Ta, TaN, WN, TaN, TaSiN, Pt, $IrO_2$ or $RuO_2$ or combinations thereof.

13. The method of claim 9, wherein said MIM dielectric comprises about 2 to 20 nm of $SiO_2$, $Si_3N_4$ or SiC, a high K dielectric, $Ta_2O_5$, $BaTiO_3$, $HfO_2$, $ZrO_2$ or $Al_2O_3$, or combinations thereof.

14. The method of claim 9, wherein said top electrode comprises Al or W.

15. The method of claim 9, further including (h) after step (g) depositing a reactive ion etch stop layer over all exposed surfaces of said second conductive diffusion barrier, said MIM dielectric, said resistor, said top electrode and said interlevel dielectric layer.

16. The method device of claim 9, further including after step (f), (g) forming a reactive ion etch stop layer over all exposed surfaces of said conductive diffusion barrier, said MIM dielectric, said interlevel dielectric, and said top electrode.

17. The method of claim 9, wherein at least two sides of said top electrode do not extend past and first conductive diffusion barrier.

18. The method of claim 9, wherein:

step (e) further includes simultaneously forming a resistor on said top surface of said interlevel dielectric layer with said conductive diffusion barrier; and step (f) further includes forming said MIM dielectric on a top surface of said resistor.

19. The method of claim 18, wherein said resistor comprises about 5 to 200 nm of a refractory metal, W, Ta, TaN, WN, TaN, TaSiN, Pt, $IrO_2$ or $RuO_2$ or combinations of layers thereof.

* * * * *